United States Patent
Oh et al.

(10) Patent No.: US 10,340,415 B2
(45) Date of Patent: Jul. 2, 2019

(54) SEMICONDUCTOR DEVICE AND SEMICONDUCTOR DEVICE PACKAGE INCLUDING THE SAME

(71) Applicant: LG INNOTEK CO., LTD., Seoul (KR)

(72) Inventors: Hyun Jee Oh, Seoul (KR); Rak Jun Choi, Seoul (KR); Byeoung Jo Kim, Seoul (KR)

(73) Assignee: LG Innotek Co., Ltd., Seoul (KR)

(*) Notice: Subject to any disclaimer, the term of this patent is extended or adjusted under 35 U.S.C. 154(b) by 0 days.

(21) Appl. No.: 15/692,617

(22) Filed: Aug. 31, 2017

(65) Prior Publication Data

US 2018/0069150 A1    Mar. 8, 2018

(30) Foreign Application Priority Data

Sep. 1, 2016   (KR) .................. 10-2016-0112809
Dec. 2, 2016   (KR) .................. 10-2016-0163830

(51) Int. Cl.
*H01L 33/06* (2010.01)
*H01L 33/00* (2010.01)
(Continued)

(52) U.S. Cl.
CPC .............. *H01L 33/06* (2013.01); *H01L 22/12* (2013.01); *H01L 23/62* (2013.01);
(Continued)

(58) Field of Classification Search
CPC . H01L 33/06; H01L 33/0025; H01L 33/0075; H01L 33/0079; H01L 33/14;
(Continued)

(56) References Cited

U.S. PATENT DOCUMENTS 5,153,889 A * 10/1992 Sugawara ............. B82Y 20/00
                                                    257/461
6,614,119 B1 * 9/2003 Asahina ............ H01L 21/28518
                                                    257/753
(Continued)

FOREIGN PATENT DOCUMENTS

EP    1 385 215 A2   1/2004
EP    3 043 395       7/2016
(Continued)

OTHER PUBLICATIONS

European Search Report issued in Application EP 17 18 8926 dated Dec. 21, 2017.
(Continued)

*Primary Examiner* — Ida M Soward
(74) *Attorney, Agent, or Firm* — KED & Associates LLP

(57) ABSTRACT

A semiconductor device includes a semiconductor structure including a first conductive semiconductor layer, a second conductive semiconductor layer, and an active layer provided between the first conductive semiconductor layer and the second conductive semiconductor layer, and a semiconductor device package including the semiconductor device. The active layer includes a plurality of barrier layers and a plurality of well layers. The second conductive semiconductor layer includes a conductive second semiconductor layer and a conductive first semiconductor layer provided on the conductive second semiconductor layer. The conductive second semiconductor layer has a higher aluminum composition than the well layers, and the conductive first semiconductor layer has a lower aluminum composition than the well layers.

20 Claims, 23 Drawing Sheets

(51) Int. Cl.
*H01L 33/14* (2010.01)
*H01L 33/22* (2010.01)
*H01L 33/32* (2010.01)
*H01L 33/38* (2010.01)
*H01L 33/42* (2010.01)
*H01L 23/62* (2006.01)
*H01L 25/07* (2006.01)
*H01S 5/04* (2006.01)
*H01S 5/22* (2006.01)
*H01S 5/34* (2006.01)
*H01L 21/66* (2006.01)
*H01L 25/075* (2006.01)
*H01S 5/042* (2006.01)
*H01S 5/343* (2006.01)
*H01L 33/04* (2010.01)

(52) U.S. Cl.
CPC ...... *H01L 25/0753* (2013.01); *H01L 33/0025* (2013.01); *H01L 33/0075* (2013.01); *H01L 33/0079* (2013.01); *H01L 33/14* (2013.01); *H01L 33/22* (2013.01); *H01L 33/32* (2013.01); *H01L 33/382* (2013.01); *H01L 33/42* (2013.01); *H01S 5/0425* (2013.01); *H01S 5/22* (2013.01); *H01S 5/34333* (2013.01); *H01S 5/34346* (2013.01); *H01L 33/04* (2013.01); *H01L 33/145* (2013.01)

(58) Field of Classification Search
CPC ....... H01L 33/22; H01L 33/32; H01L 33/382; H01L 33/42; H01L 22/12; H01L 23/62; H01L 25/0753; H01S 5/0425; H01S 5/22; H01S 5/34333; H01S 5/34346
See application file for complete search history.

(56) References Cited

U.S. PATENT DOCUMENTS

| | | | |
|---|---|---|---|
| 6,777,253 B2* | 8/2004 | Ishibashi | B82Y 20/00 257/E21.125 |
| 8,154,042 B2 | 4/2012 | Aldaz et al. | |
| 8,476,666 B2 | 7/2013 | Kim et al. | |
| 8,488,644 B2* | 7/2013 | Imai | H01S 5/18341 372/46.01 |
| 8,994,001 B2* | 3/2015 | Son | H01L 33/06 257/103 |
| 9,276,167 B2 | 3/2016 | Hoppel | |
| 9,401,452 B2* | 7/2016 | Northrup | H01S 5/0421 |
| 9,540,252 B1 | 1/2017 | Collins et al. | |
| 9,711,682 B2* | 7/2017 | Han | H01L 33/12 |
| 9,748,410 B2* | 8/2017 | Kinoshita | H01L 21/02389 |
| 2003/0006418 A1 | 1/2003 | Emerson et al. | |
| 2003/0141506 A1 | 7/2003 | Sano et al. | |
| 2005/0179045 A1 | 8/2005 | Ryu et al. | |
| 2006/0131558 A1 | 6/2006 | Sato et al. | |
| 2007/0205375 A1* | 9/2007 | Ward | B82Y 10/00 250/398 |
| 2010/0096652 A1 | 4/2010 | Choi et al. | |
| 2013/0082237 A1 | 4/2013 | Northrup et al. | |
| 2014/0084274 A1* | 3/2014 | Yamazaki | H01L 51/5004 257/40 |
| 2016/0111600 A1 | 4/2016 | Chae et al. | |
| 2016/0149078 A1 | 5/2016 | Takeuchi et al. | |
| 2016/0218262 A1 | 7/2016 | Aketa et al. | |
| 2016/0284941 A1 | 9/2016 | Seo et al. | |
| 2017/0098736 A1* | 4/2017 | Lee | H01L 33/54 |
| 2017/0170360 A1* | 6/2017 | Bour | H01L 33/145 |
| 2018/0076355 A1 | 3/2018 | Hayashi et al. | |

FOREIGN PATENT DOCUMENTS

| | | |
|---|---|---|
| EP | 3 073 539 | 9/2016 |
| EP | 3 291 314 | 3/2018 |
| JP | 2001-203385 | 7/2001 |
| JP | 2003-115642 | 4/2003 |
| JP | 2004-104157 | 4/2004 |
| JP | 2008-285758 | 11/2008 |
| JP | 2010-171272 | 8/2010 |
| JP | 2013-149889 | 8/2013 |
| JP | 2014-241397 | 12/2014 |
| JP | 2016-044095 | 4/2016 |
| JP | 2016-066691 | 4/2016 |
| JP | 2016-084822 | 5/2016 |
| JP | 2016-213448 | 12/2016 |
| KR | 2010-0044726 | 4/2010 |
| KR | 10-1458389 | 11/2014 |
| KR | 2016-0062659 | 6/2016 |
| KR | 2016-0105126 | 9/2016 |
| KR | 2016-0117010 | 10/2016 |
| WO | WO 2005/101532 | 10/2005 |
| WO | WO 2016/004374 A1 | 1/2016 |
| WO | WO 2016/159638 | 10/2016 |
| WO | WO 2016/163083 | 10/2016 |
| WO | WO 2017/049053 | 3/2017 |

OTHER PUBLICATIONS

Extended European Search Report issued in Application 17203483.7 dated Mar. 28, 2018.
United States Office Action dated Feb. 21, 2019 issued in co-pending related U.S. Appl. No. 15/821,519.
Japanese Office Action dated Mar. 27, 2019 issued in Application No. 2017-168498.

* cited by examiner

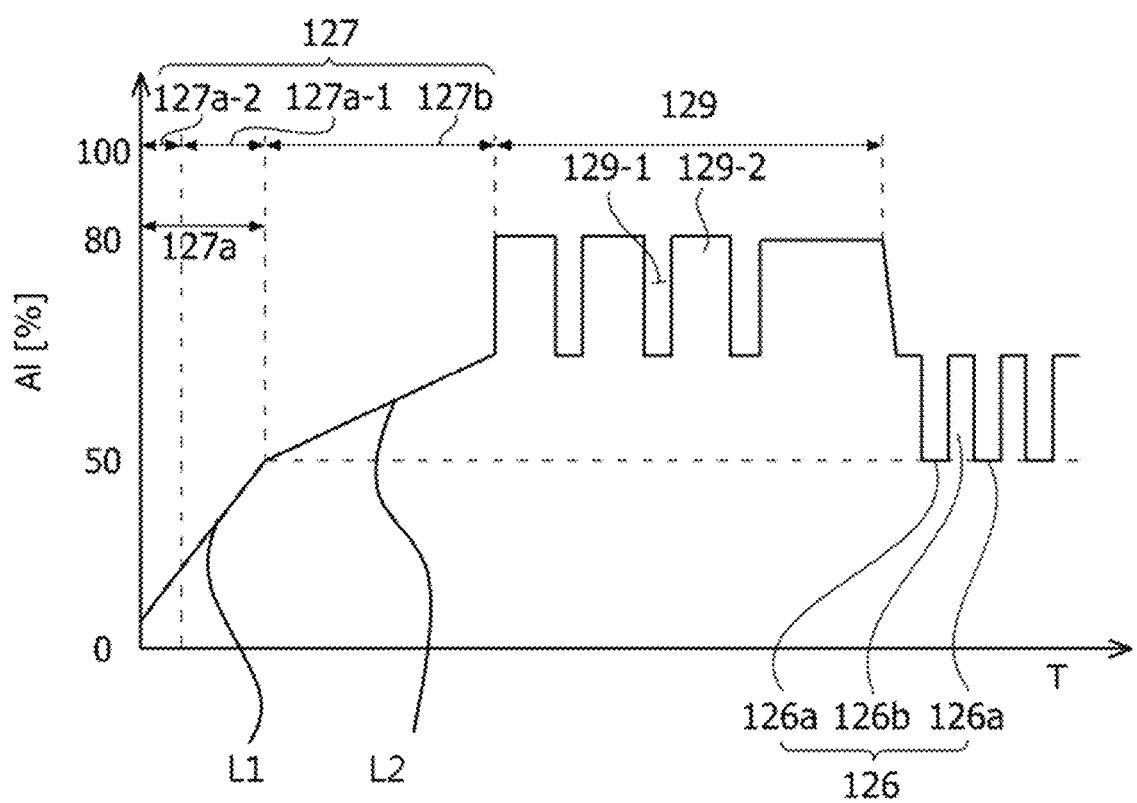

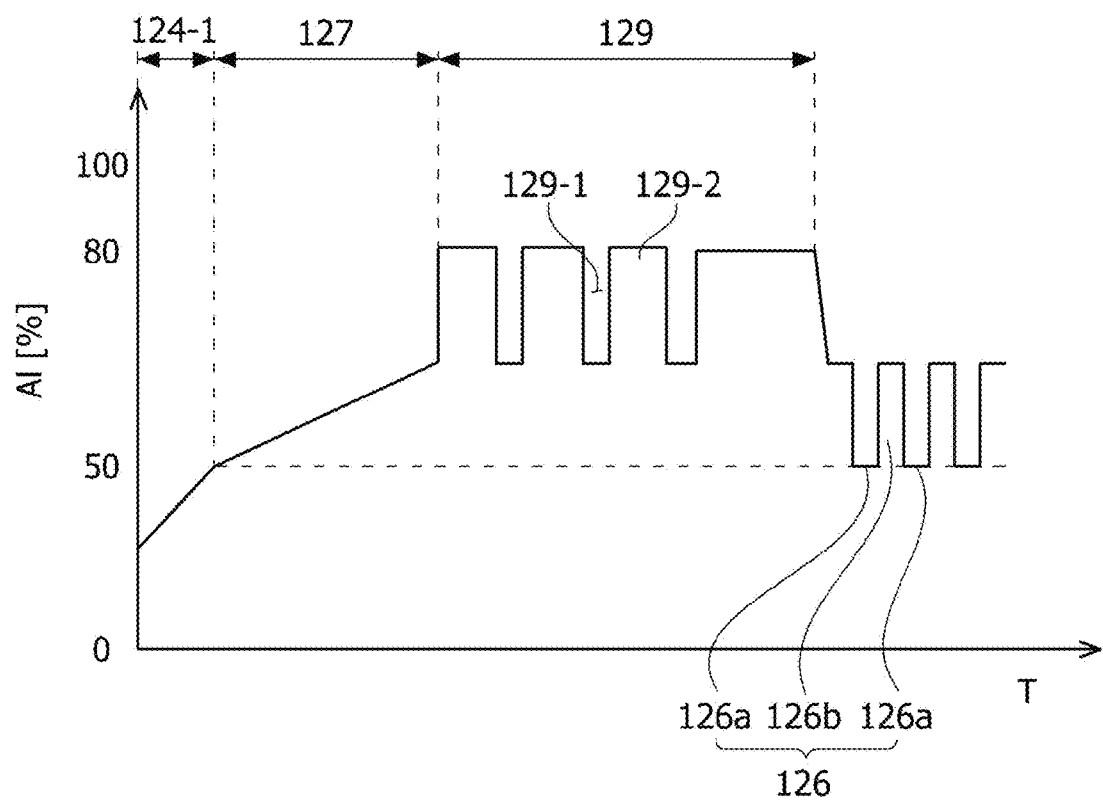

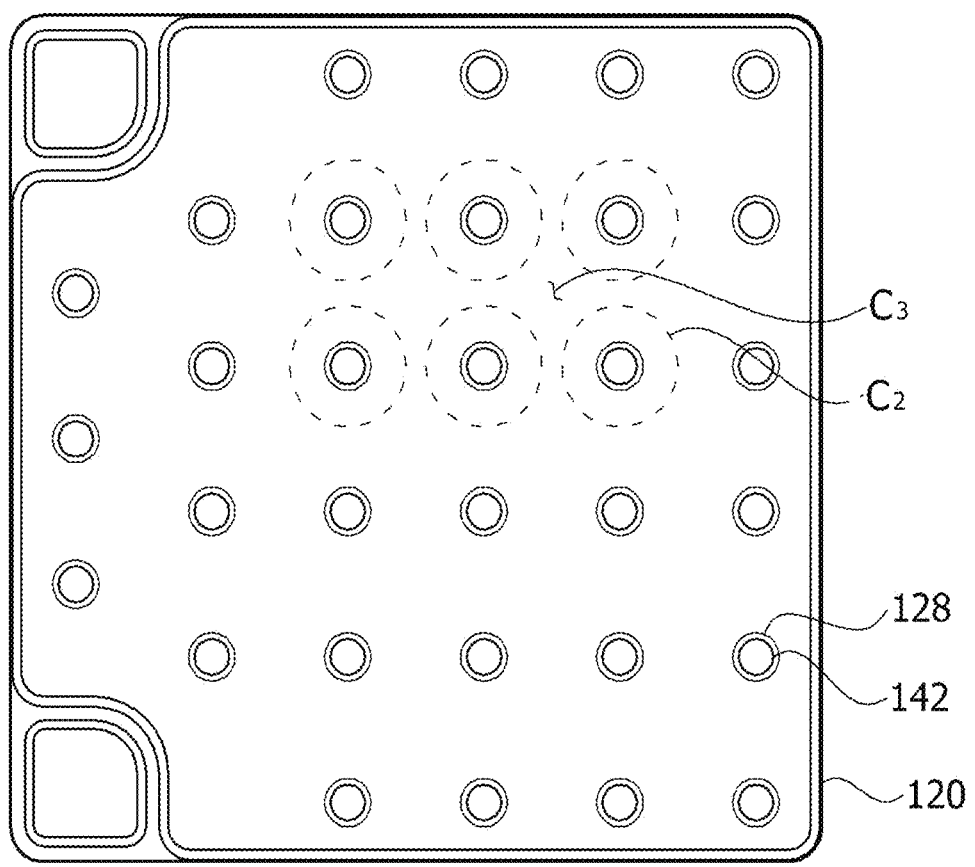

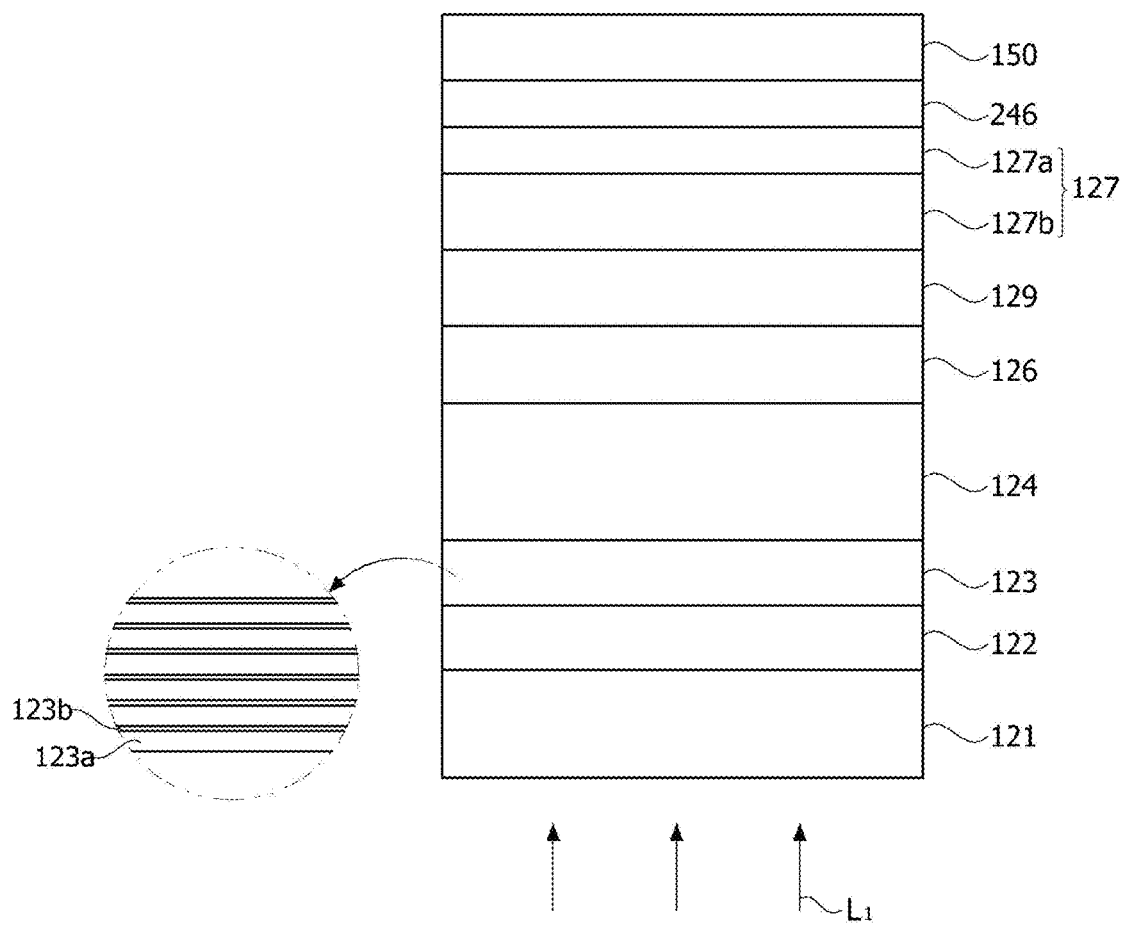

FIG. 8
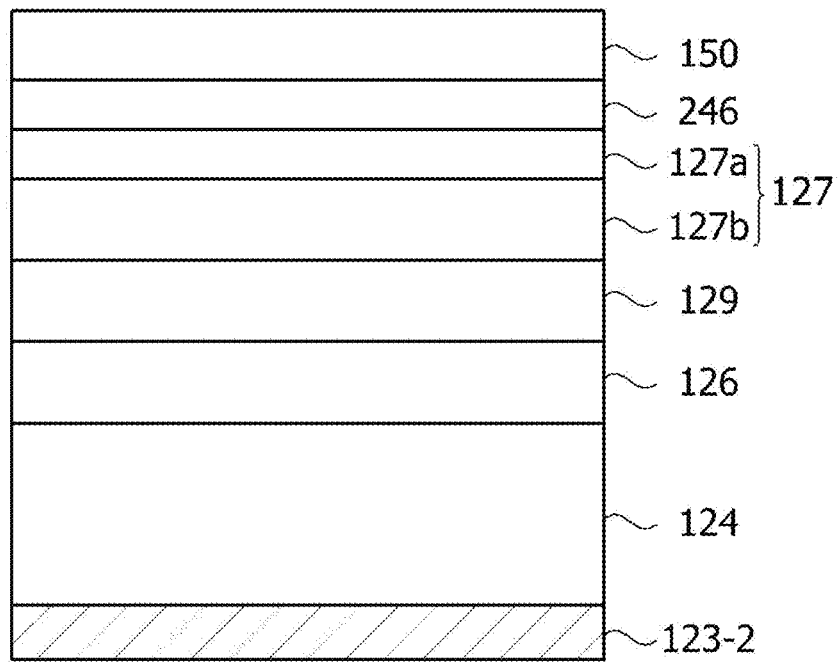
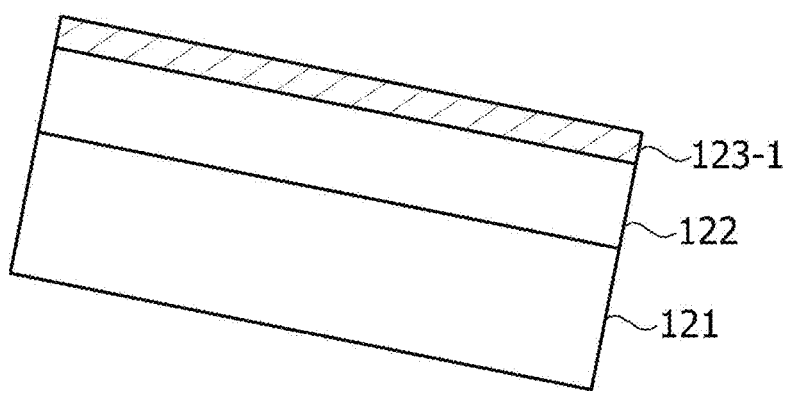

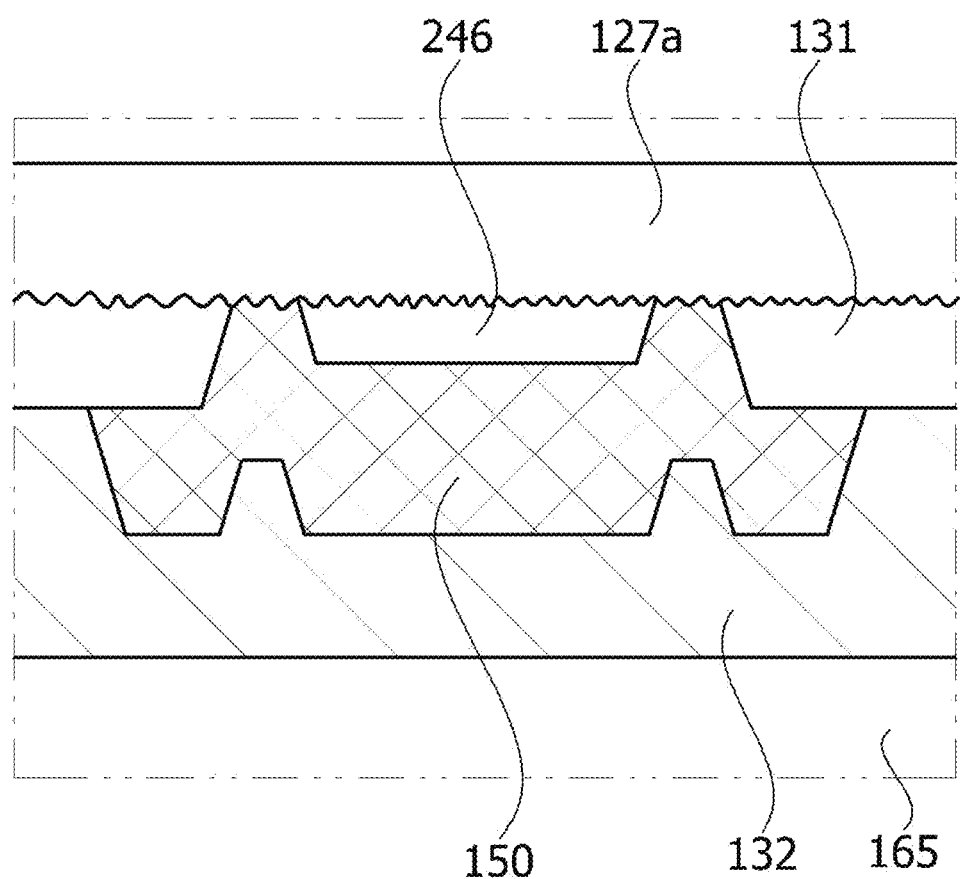

SEMICONDUCTOR DEVICE AND SEMICONDUCTOR DEVICE PACKAGE INCLUDING THE SAME

CROSS-REFERENCE TO RELATED APPLICATIONS

This application claims priority under 35 U.S.C. § 119 to Korean Application Nos. 10-2016-0112809, filed on Sep. 1, 2016, and 10-2016-0163830, filed on Dec. 2, 2016, whose entire disclosures are hereby incorporated by reference.

BACKGROUND

1. Field

Embodiments relate to a semiconductor device and a semiconductor device package including the same.

2. Background

Semiconductor devices including compounds such as GaN and AlGaN have many merits such as wide and adjustable band gap energy and thus may be variously used as light emitting devices, light receiving devices, various kinds of diodes, or the like.

In particular, light emitting devices using group III-V or II-VI compound semiconductors or light emitting devices such as a laser diode may implement various colors such as red, green, blue, and ultraviolet due to the development of thin film growth technology and device materials and implement efficient white light rays by using fluorescent materials or combining colors. These light emitting devices also have advantages with respect to low power consumption, semi-permanent life span, fast response time, safety, and environmental friendliness compared to conventional light sources such as a fluorescent lamp, an incandescent lamp, or the like.

In addition, when light receiving devices such as optical detectors or solar cells are produced using group III-V or II-VI compound semiconductors, an optical current is generated by absorbing light in various wavelength ranges due to development of device materials, and thus light may be used in various wavelength ranges from gamma rays to radio wavelength regions. Also, the light receiving devices have the advantages of fast response time, stability, environmental friendliness, and ease of adjustment of device materials and may be easily used to power control or microwave circuits or communication modules.

Accordingly, semiconductor devices are being extended and applied to the transmission modules of optical communication means, light emitting diode backlights substituted for cold cathode fluorescence lamps (CCFL) forming the backlights of liquid crystal display (LCD) devices, white light emitting diode lamps to be substituted for fluorescent bulbs, incandescent bulbs, car headlights, traffic lights, and sensors for detecting gas or fire. In addition, semiconductor devices may also be extended and applied to high-frequency application circuits or other power control devices and communication modules.

In particular, a light emitting device that emits light in an ultraviolet wavelength range may be used for curing, medical, and sterilization purposes due to its curing or sterilizing action.

Recently, research on ultraviolet light emitting devices has been actively conducted, but the ultraviolet light emitting devices are difficult to vertically realize and also have decreased crystallinity during the substrate separation process.

BRIEF DESCRIPTION OF THE DRAWINGS

The embodiments will be described in detail with reference to the following drawings in which like reference numerals refer to like elements wherein:

FIG. 2 is a graph showing an aluminum composition of the semiconductor structure according to the first embodiment of the present disclosure;

FIG. 3B is a graph showing an aluminum composition of the semiconductor structure according to the second embodiment of the present disclosure;

FIGS. 6A and 6B are plan views of a semiconductor device according to an embodiment of the present disclosure;

FIG. 7 is a diagram of a semiconductor structure grown on a substrate;

FIG. 8 is a diagram illustrating a substrate separation process;

FIG. 21B is a view enlarging portion A of FIG. 20;

DETAILED DESCRIPTION

The following embodiments may be modified or combined with each other, and the scope of the present disclosure is not limited to the embodiments.

Details described in a specific embodiment may be understood as descriptions associated with other embodiments unless otherwise stated or contradicted even if there is no description thereof in the other embodiments.

For example, when features of element A are described in a specific embodiment and features of element B are described in another embodiment, an embodiment in which element A and element B are combined with each other should be understood as falling within the scope of the present disclosure unless otherwise stated or contradicted even if not explicitly stated.

In the descriptions of embodiments, when an element is referred to as being above or under another element, the two elements may be in direct contact with each other, or one or more other elements may be provided between the two elements. In addition, the term "above or under" used herein may represent a downward direction in addition to an upward direction with respect to one element.

Hereinafter, example embodiments will be described in detail with reference to the accompanying drawings so that they can be easily practiced by those skilled in the art to which the present disclosure pertains.

A semiconductor structure according to an embodiment of the present disclosure may output light of an ultraviolet wavelength band. For example, the semiconductor structure may output light of near-ultraviolet wavelengths (UV-A), light of far-ultraviolet wavelengths (UV-B), or light of deep-ultraviolet wavelengths (UV-C). The wavelength range may be determined by the aluminum composition of the semiconductor structure.

For example, the light of near-ultraviolet wavelengths (UV-A) may have wavelengths ranging from 320 nm to 420 nm, the light of far-ultraviolet wavelengths (UV-B) may have wavelengths ranging from 280 nm to 320 nm, and the light of deep-ultraviolet wavelengths (UV-C) may have wavelengths ranging from 100 nm to 280 nm.

Figure 1:
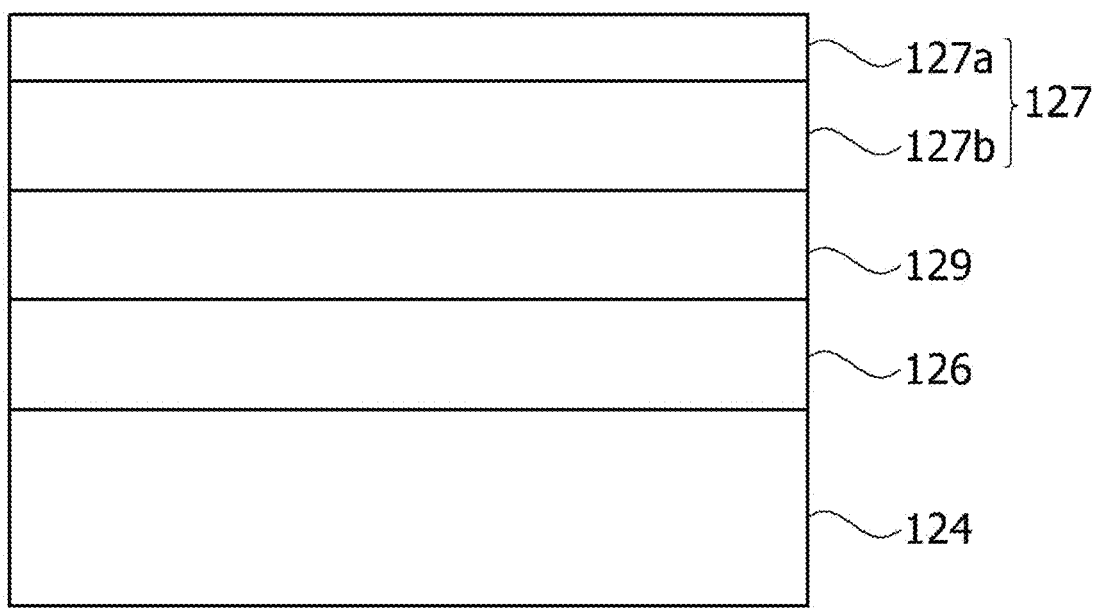
FIG. 1 is a diagram of a semiconductor structure according to a first embodiment of the present disclosure.

FIG. 1 is a diagram of a semiconductor structure according to an embodiment of the present disclosure, and FIG. 2 is a graph showing the aluminum composition of the semiconductor structure according to an embodiment of the present disclosure.

Referring to FIG. 1, a semiconductor device according to an embodiment of the present disclosure includes a semiconductor structure 120A, which includes a first conductive semiconductor layer 124, a second conductive semiconductor layer 127, and an active layer 126 provided between the first conductive semiconductor layer 124 and the second conductive semiconductor layer 127.

The first conductive semiconductor layer 124 may be made of a group III-V or group II-VI compound semiconductor and may be doped with a first dopant. The first conductive semiconductor layer 124 may be made of a material selected from among semiconductor materials having an empirical formula $In_{x1}Al_{y1}Ga_{1-x1-y1}N$ ($0 \leq x1 \leq 1$, $0 \leq y1 \leq 1$, and $0 \leq x1+y1 \leq 1$) such as GaN, AlGaN, InGaN, InAlGaN, and so on. Also, the first dopant may be an n-type dopant such as Si, Ge, Sn, Se, and Te. When the first dopant is an n-type dopant, the first conductive semiconductor layer 124 doped with the first dopant may be an n-type semiconductor layer.

The active layer 126 is provided between the first conductive semiconductor layer 124 and the second conductive semiconductor layer 127. The active layer 126 is a layer in which electrons (or holes) injected through the first conductive semiconductor layer 124 are combined with holes (or electrons) injected through the second conductive semiconductor layer 127. The active layer 126 may transition to a lower energy level due to recombination between an electron and a hole and generate light having an ultraviolet wavelength.

The active layer 126 may have, but is not limited to, any one of a single-well structure, a multi-well structure, a single-quantum-well structure, a multi-quantum-well (MQW) structure, a quantum dot structure, or a quantum wire structure. Also, the active layer 126 may include a well layer 126a, and a barrier layer 126b, and the barrier layer 126b may have a greater energy band gap than the well layer 126a.

The second conductive semiconductor layer 127 may be formed on the active layer 126 and be made of a group III-V or group II-VI compound semiconductor. The second conductive semiconductor layer 127 may also be doped with a second dopant. The second conductive semiconductor layer 127 may be made of a semiconductor material having an empirical formula $In_{x5}Al_{y2}Ga_{1-x5-y2}N$ ($0 \leq x5 \leq 1$, $0 \leq y2 \leq 1$, and $0 \leq x5+y2 \leq 1$) or a material selected from among AlInN, AlGaAs, GaP, GaAs, GaAsP, and AlGaInP. When the second dopant is a p-type dopant such as Mg, Zn, Ca, Sr, and Ba, the second conductive semiconductor layer 127 doped with the second dopant may be a p-type semiconductor layer.

The second conductive semiconductor layer 127 may include a conductive first semiconductor layer 127a having a relatively low aluminum composition and a conductive second semiconductor layer 127b having a relatively high aluminum composition.

A blocking layer 129 may be provided between the active layer 126 and the second conductive semiconductor layer 127. The blocking layer 129 may block first carriers supplied from the first conductive semiconductor layer 124 to the active layer 126 from flowing out to the second conductive semiconductor layer 127 and may increase the probability that first carriers will be recombined with second carriers in the active layer 126. The blocking layer 129 may have a greater energy band gap than the active layer 126 and/or the second conductive semiconductor layer 127.

The blocking layer 129 may be made of a material selected from among semiconductor materials having an empirical formula $In_{x1}Al_{y1}Ga_{1-x1-y1}N$ ($0 \leq x1 \leq 1$, $0 \leq y1 \leq 1$, and $0 \leq x1+y1 \leq 1$), for example, AlGaN, InGaN, InAlGaN, and so on, but is not limited thereto. In the blocking layer 129, a first layer having a high aluminum composition 129b and a second layer having a low aluminum composition 129a may be alternately provided.

Referring to FIG. 2, the first conductive semiconductor layer 124, the barrier layer 126b, the well layer 126a, the conductive second semiconductor layer 127b, and the conductive first semiconductor layer 127a may be GaN-based semiconductors including aluminum.

The first conductive semiconductor layer 124, the barrier layer 126b, the well layer 126a, the conductive second semiconductor layer 127b, and the conductive first semiconductor layer 127a may be made of AlGaN, but are not limited thereto.

The conductive second semiconductor layer 127b may have a thickness greater than about 10 nm and less than about 200 nm. When the conductive second semiconductor layer 127b has a thickness less than about 10 nm, it may be difficult for electric current to spread evenly in the conductive second semiconductor layer 127b, and it also may be difficult to evenly inject electric current to the area of the top surface of the semiconductor device. When the conductive second semiconductor layer 127b has a thickness greater than about 200 nm, it is possible for there to be a reduction in injection efficiency for electric current injected into the active layer 126 due to an increase in resistance.

The conductive second semiconductor layer 127b may have a higher aluminum composition than the well layer 126a. In order to generate ultraviolet light, the well layer 126a may have an aluminum composition ranging from about 30% to about 50%. When the conductive second semiconductor layer 127b has a lower aluminum composition than the well layer 126a, light extraction efficiency may be reduced because the conductive second semiconductor layer 127b absorbs light.

The conductive second semiconductor layer 127b may have an aluminum composition ranging from about 40% to about 80%. It is possible to reduce light absorption when the conductive second semiconductor layer 127b has an aluminum composition of 40% or higher and also possible to reduce deterioration of electric current injection efficiency when the conductive second semiconductor layer 127b has an aluminum composition of 80% or less. For example, when the well layer 126a has an aluminum composition of 30%, the conductive second semiconductor layer 127b may have an average aluminum composition of 40%.

The conductive first semiconductor layer 127a may have a lower aluminum composition than the well layer 126a. When the conductive first semiconductor layer 127a has a higher aluminum composition than the well layer 126a, the conductive first semiconductor layer 127a is not sufficiently ohmic with a p-ohmic electrode due to an increase in resistance therebetween, and also electric current injection efficiency is reduced.

The conductive first semiconductor layer 127a may have an aluminum composition greater than about 1% and less than about 50%. When the aluminum composition is greater than about 50%, the conductive first semiconductor layer 127a may not be sufficiently ohmic with a p-ohmic electrode. When the aluminum composition is less than about 1%, the aluminum composition is close to a GaN composition, and thus the conductive first semiconductor layer 127a absorbs light.

The conductive first semiconductor layer 127a may have a thickness greater than about 1 nm and less than about 30 nm. As described above, the conductive first semiconductor layer 127a may absorb ultraviolet light because the conductive first semiconductor layer 127a has an aluminum composition low enough to be ohmic. Accordingly, it may be advantageous in terms of optical output power to control the conductive first semiconductor layer 127a to be as thin as possible.

However, when the thickness of the conductive first semiconductor layer 127a is controlled to be 1 nm or less, the conductive first semiconductor layer 127a may not be provided in some sections, and a region in which the conductive second semiconductor layer 127b is exposed outside the semiconductor structure 120 may be generated. Accordingly, it is possible for there to be a reduction in injection efficiency of electric current injected into the semiconductor device and an increase in the operating voltage of the semiconductor device. Also, when the thickness is greater than about 30 nm, the absorbed quantity of light is so large that optical output power efficiency may decrease.

The conductive first semiconductor layer 127a may include a surface layer 127a-2, and an adjustment layer 127a-1. The surface layer 127a-2 may be a region that is in contact with a p-ohmic electrode, and the adjustment layer 127a-1 may be a region that adjusts aluminum composition.

The surface layer 127a-2 may have an aluminum composition greater than about 1% and less than about 20%.

When the aluminum composition is greater than or equal to 1%, it is possible to solve the problem of an excessively increasing light absorption rate in the surface layer 127a-2. When the aluminum composition is less than or equal to 20%, it is possible to alleviate the problem of the reduction in electric current injection efficiency due to an increase in contact resistance of a second electrode (a p-ohmic electrode).

However, the present disclosure is not limited thereto, and the aluminum composition of the surface layer 127a-2 may be adjusted in consideration of electric current injection characteristics and light absorption rate. Alternatively, the aluminum composition of the surface layer 127a-2 may be adjusted according to optical output power required by a product.

For example, when the electric current injection characteristics are more important than the light absorption rate in products to which semiconductor devices are applied, the aluminum composition of the surface layer 127a-2 may be adjusted to within the range of about 1% to about 10%. When optical output power characteristics are more important than electrical characteristics in products to which semiconductor devices are applied, the aluminum composition of the surface layer 127a-2 may be adjusted to within the range of about 10% to about 20%.

When the aluminum composition of the surface layer 127a-2 is greater than about 1% and less than about 20%, the operating voltage may decease due to a decrease in resistance between the surface layer 127a-2 and the second electrode. Accordingly, it is possible to enhance the electrical characteristics. The surface layer 127a-2 may have a thickness greater than about 1 nm and less than about 10 nm. Accordingly, it is possible to alleviate the light absorption problem.

The conductive first semiconductor layer 127a may have a smaller thickness than the conductive second semiconductor layer 127b. The thickness ratio of the conductive first semiconductor layer 127a to the conductive second semiconductor layer 127b may range from 1:1.5 to 1:20. When the thickness ratio is 1:1.5 or greater (for example, 1:1.6), it is possible to improve the electric current injection efficiency by achieving a sufficient thickness for the conductive second semiconductor layer 127b. When the thickness ratio is 1:20 or less, it is possible to alleviate the problem of ohmic reliability being reduced due to an insufficient thickness of the conductive first semiconductor layer 127a.

The aluminum composition of the conductive second semiconductor layer 127b may decrease with a second slope L2 as the conductive second semiconductor layer 127b gets farther away from the active layer 126. Also, the aluminum composition of the conductive second semiconductor layer 127b may decrease with a first slope L1 as the conductive second semiconductor layer 127b gets farther away from the active layer 126. Accordingly, the aluminum composition of the surface layer 127a-2 may satisfy the range of about 1% to about 20%.

However, the present disclosure is not limited thereto, and the aluminum compositions of the conductive second semiconductor layer 127*b* and the conductive first semiconductor layer may not continuously decrease but may include some sections in which there is no decrease.

In this case, the conductive first semiconductor layer 127*a* may have a greater aluminum reduction than the conductive second semiconductor layer 127*b*. That is, the first slope L1 may be greater than the second slope L2. Here, the slope may be determined on the basis of semiconductor layer thickness and aluminum reduction.

The conductive second semiconductor layer 127*b* is thicker and has a smaller change in aluminum composition than the conductive first semiconductor layer 127*a*. Thus, the second slope L2 may be relatively gentle.

However, the conductive first semiconductor layer 127*a* is thin and has a large change in aluminum composition. Thus, the first slope L1 may be relatively steep.

Figure 3A:
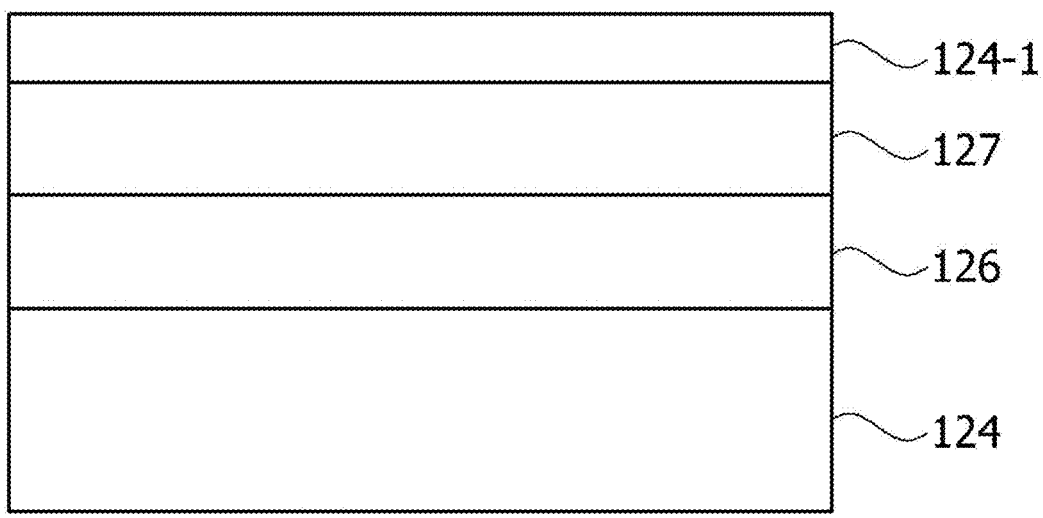
FIG. 3A is a diagram of a semiconductor structure according to a second embodiment of the present disclosure.

FIG. 3A is a diagram of a semiconductor structure according to another embodiment of the present disclosure, and FIG. 3B is a graph showing aluminum composition according to another embodiment of the present disclosure.

Referring to FIGS. 3A and 3B, a semiconductor device according to an embodiment of the present disclosure includes a semiconductor structure 120B, which includes a first conductive semiconductor layer 124, a second conductive semiconductor layer 127, an active layer 126 between the first conductive semiconductor layer 124 and the second conductive semiconductor layer 127, and a third conductive semiconductor layer 124-1 provided on the second conductive semiconductor layer 127.

The second conductive semiconductor layer 127 may have a thickness greater than about 20 nm and less than about 200 nm. When the second conductive semiconductor layer 127 has a thickness less than about 20 nm, it is possible for there to be a reduction in electric current injection efficiency because of an increase in resistance. When the second conductive semiconductor layer 127 has a thickness greater than about 200 nm, it is possible for there to be a deterioration in crystallinity and an increase in the probability that light emitted by the active layer 126 will be absorbed because of the excessive thickness of the second conductive semiconductor layer 127.

The second conductive semiconductor layer 127 may have an aluminum composition greater than about 40% and less than about 80%. When the aluminum composition of the second conductive semiconductor layer 127 is less than about 40%, light may be absorbed. When the aluminum composition of the second conductive semiconductor layer 127 is greater than about 80%, crystallinity may be bad, and electric current injection efficiency may be insufficient.

The third conductive semiconductor layer 124-1 may have an aluminum composition greater than about 1% and less than about 60%. The third conductive semiconductor layer 124-1 may be doped with an n-type dopant and may have the same polarity as the first conductive semiconductor layer 124. For example, the first and third conductive semiconductor layers 124 and 124-1 may be made of n-AlGaN. In this case, the second conductive semiconductor layer 127 may be made of P—AlGaN doped with a p-type dopant.

Since electrical characteristics are better between the third conductive semiconductor layer 124-1 and the second electrode (the ITO) than between the second conductive semiconductor layer 127 and the second electrode (the ITO), the aluminum composition of the second conductive semiconductor layer 127 may be controlled to be higher than that of the well layer 126*a*. Accordingly, it is possible to reduce absorbed light and enhance optical output power.

The third conductive semiconductor layer 124-1 may have a thickness less than about 10 nm. When the third conductive semiconductor layer 124-1 has a thickness greater than about 10 nm, the tunneling effect may be weakened. Accordingly, it is possible for there to be a reduction in the efficiency with which second carriers are injected to the active layer 126 through the second conductive semiconductor layer 127. Accordingly, the third conductive semiconductor layer 124-1 may have a smaller thickness than the second conductive semiconductor layer 127.

Figure 4:
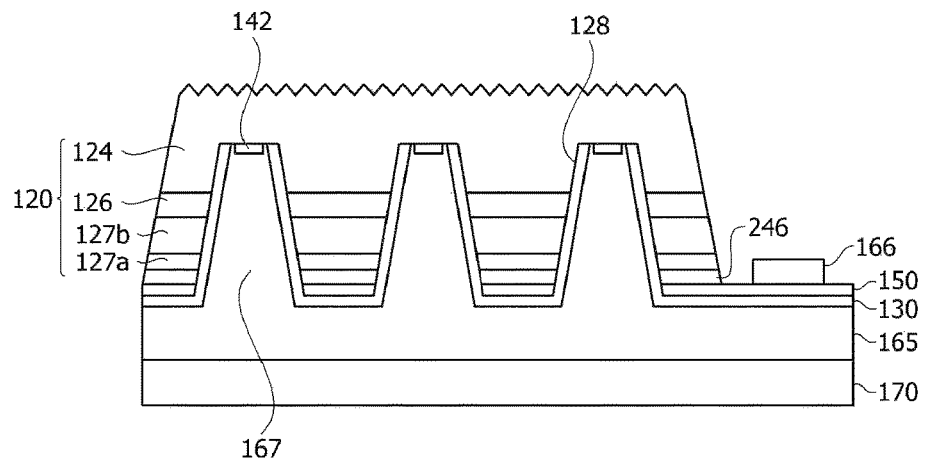
FIG. 4 is a diagram of a semiconductor device according to the first embodiment of the present disclosure.

FIG. 4 is a view of a semiconductor device according to an embodiment of the present disclosure.

Referring to FIG. 4, the structure that has been described with reference to FIGS. 1 and 2 may be applied to a semiconductor structure 120. A recess 128 may be provided in the bottom surface of the second conductive semiconductor layer 127 and also in a portion of the first conductive semiconductor layer 124 through the active layer 126.

A first conductive layer 165 includes a connection electrode 167 provided in the recess 128 and electrically connected to the first conductive semiconductor layer 124. A first electrode 142 may be provided between the connection electrode 167 and the first conductive semiconductor layer 124. The first electrode 142 may be an ohmic electrode.

The distance between the top surface of the recess 128 and the top surface of the semiconductor structure may range from about 1 μm to about 4 μm. When the distance between the top surface of the semiconductor structure and the top surface of the recess 128 is less then 1 μm, it is possible for there to be a reduction in reliability of an emitting device. When the distance is greater than about 4 μm, it is possible for there to be a reduction in light extraction efficiency due to defects of the crystal provided inside the semiconductor structure or the like.

A second conductive layer 150 may be provided under and electrically connected to the conductive first semiconductor layer. The second conductive layer 150 may be provided between a plurality of connection electrodes 167. The second conductive layer 150 may be partially exposed and electrically connected to a second electrode pad 166.

A second electrode 246 may be provided between and electrically connected to the second conductive layer 150 and the conductive first semiconductor layer 127*a*. The surface layer of the conductive first semiconductor layer 127*a* may have a relatively low aluminum composition and thus facilitate an ohmic connection. The conductive first semiconductor layer 127*a* has a thickness greater than about 1 nm and less than about 30 nm and thus may have low light absorption.

The first conductive layer 165 and the second conductive layer 150 may be made of a transparent conductive oxide (TCO). The transparent conductive oxide may be selected from among an indium tin oxide (ITO), an indium zinc oxide (IZO), an aluminum zinc oxide (AZO), an aluminum gallium zinc oxide (AGZO), an indium zinc tin oxide (IZTO), an indium aluminum zinc oxide (IAZO), an indium gallium zinc oxide (IGZO), an indium gallium tin oxide (IGTO), an antimony tin oxide (ATO), a gallium zinc oxide (GZO), an IZO nitride (IZON), ZnO, $IrO_x$, $RuO_x$, and NiO.

The first conductive layer 165 and the second conductive layer 150 may include an opaque metal such as Ag, Ni, Al, Rh, Pd, Ir, Ru, Mg, Zn, Pt, Au, and Hf. The first conductive layer 165 may be formed in single or multiple layers in which a TCO and an opaque metal are mixed, but is not limited thereto.

An insulation layer 130 may be made of at least one material selected from a group consisting of $SiO_2$, $Si_xO_y$, $Si_3N_4$, $Si_xN_y$, $SiO_xN_y$, $Al_2O_3$, $TiO_2$, and AlN, but is not limited thereto. The insulation layer 130 may electrically insulate the connection electrode from the active layer 126 and the second conductive semiconductor layer 127.

Figure 5:
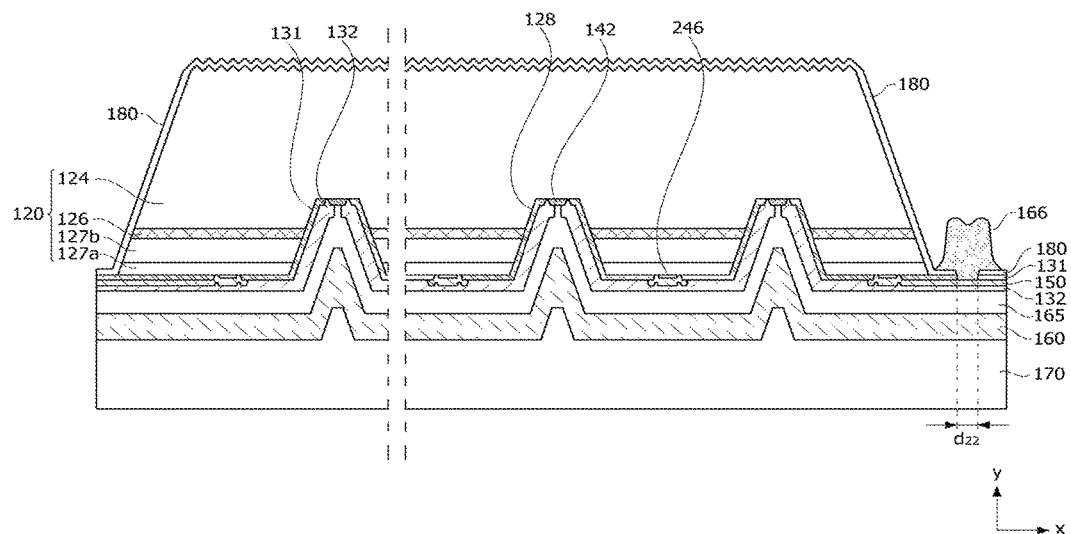
FIG. 5 is a diagram of a semiconductor device according to the second embodiment of the present disclosure.

FIG. 5 is a view of a semiconductor device according to another embodiment of the present disclosure.

The configuration of the semiconductor structure 120 that has been described with reference to FIG. 1 or FIG. 3 may be applied to the semiconductor structure 120 of FIG. 5. For example, FIG. 5 shows a semiconductor structure 120A according to the configuration of FIG. 1.

The first electrode 142 may be provided on top of the recesses 128 and electrically connected with the first conductive semiconductor layer 124. A second electrode 246 may be formed under the second conductive semiconductor layer 127.

The second electrode 246 may be brought into contact with and electrically connected to the 2-1 conductive semiconductor layer 127a.

Since the 2-1 conductive semiconductor layer 127a in contact with the second electrode 246 may have an aluminum composition of 1% to 20%, it may thus facilitate an ohmic connection with the second electrode 246. Also, the conductive first semiconductor layer 127a has a thickness greater than about 1 nm and less than about 30 nm and thus may have low light absorption.

Both the first electrode 142 and the second electrode 246 may be an ohmic electrode. Both the first electrode 142 and the second electrode 246 may be made of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, and Hf, but is not limited thereto.

A second electrode pad 166 may be provided in an edge of the semiconductor device. Since the second electrode pad 166 is provided in a region from which a first insulation layer 131 and a passivation layer 180 are partially removed, the second electrode pad 166 may have a recessed central portion and also have a top surface having a concave portion and a convex portion. A wire (not shown) may be bonded to the concave portion of the top surface. Accordingly, since the bonding area increases, the second electrode pad 166 may be strongly bonded to the wire.

The second electrode pad 166 may serve to reflect light. Thus, as the second electrode pad 166 gets closer to the semiconductor structure 120, it is possible to enhance light extraction efficiency.

The convex portion of the second electrode pad 166 may be higher than the active layer 126. Accordingly, the second electrode pad 166 may enhance light extraction efficiency and control the beam angle by upwardly reflecting light emitted from the active layer 126 in a direction horizontal to the device.

The first insulation layer 131 is partially opened under the second electrode pad 166 so that the second conductive layer 150 and the second electrode may be electrically connected to each other. The passivation layer 180 may be formed on top of and on the side of the semiconductor structure 120. The passivation layer 180 may be in contact with a region adjacent to the second electrode 246 or to the first insulation layer under the second electrode 246.

The opened part of the first insulation layer 131 where the second electrode pad 166 is in contact with the second conductive layer 150 may have a width d22 ranging, for example, from about 40 μm to about 90 μm. When the opened part has a width less than about 40 μm, the operating voltage may increase. When the opened part has a width greater than about 90 μm, it may be difficult to secure a processing margin for preventing exposure of the second conductive layer 150 to the outside. When the second conductive layer 150 is exposed outside the second electrode 246, it is possible for there to be reduction in reliability of the device. Accordingly, the width d22 may preferably range from 60% to 95% of the entire width of the second electrode pad 166.

The first insulation layer 131 may electrically insulate the first electrode 142 from the active layer 126 and the second conductive semiconductor layer 127. Also, the first insulation layer 131 may electrically insulate the second electrode 246 and the second conductive layer 150 from the first conductive layer 165.

The first insulation layer 131 may be made of at least one material selected from the group consisting of $SiO_2$, $Si_xO_y$, $Si_3N_4$, $Si_xN_y$, $SiO_xN_y$, $Al_2O_3$, $TiO_2$, and AlN, but is not limited thereto. The first insulation layer 131 may be formed in single or multiple layers. For example, the first insulation layer 131 may be a distributed Bragg reflector (DBR) having a multi-layered structure including an Si oxide or a Ti compound. However, the present disclosure is not limited thereto, and the first insulation layer 131 may include various reflective structures.

When the first insulation layer 131 has a reflective function, the first insulation layer 131 may upwardly reflect light emitted horizontally from the active layer 126, thereby enhancing light extraction efficiency. As described below, the light extraction efficiency may increase as the recesses 128 in an ultraviolet semiconductor device increase in number The second conductive layer 150 may be provided under the second electrode 246. Accordingly, the second electrode pad 166, the second conductive layer 150, and the second electrode 246 may form one electrical channel.

Also, the second conductive layer 150 may entirely surround the second electrode 246 and may be in contact with the side surface and the top surface of the first insulation layer 131. The second conductive layer 150 may be made of a material having good adhesion to the first insulation layer 131 and may also be made of at least one material selected from a group consisting of Cr, Al, Ti, Ni, and Au or an alloy thereof. The second conductive layer 150 may be made in single or multiple layers.

When the second conductive layer 150 is in contact with the side surface and the top surface of the first insulation layer 131, it is possible to enhance the thermal and electrical reliability of the second electrode 246. Also, the second conductive layer 150 may have a reflective function for upwardly reflecting light emitted from a gap between the first insulation layer 131 and the second electrode 246.

The second conductive layer 150 may also be provided a second separation distance, that is, provided in a region where the second conductive semiconductor layer is exposed between the first insulation layer 131 and the second electrode 246. The second conductive layer 150 may be provided in contact with a side surface and the top surface of the second electrode 246 and the side surface and the top surface of the first insulation layer 131 at the second separation distance.

Also, a region where a Schottky junction is formed by the second conductive semiconductor layer 127 coming into contact with the second conductive layer 150 may be provided within the second separation distance. By forming the Schottky junction, it is possible to facilitate distribution of electric current.

The second insulation layer 132 may electrically insulate the second electrode 246 and the second conductive layer 150 from the first conductive layer 165. The first conductive layer 165 may be electrically connected to the first electrode 142 via the second insulation layer 132.

The first conductive layer 165 and a junction layer 160 may be provided according to the bottom surface of the semiconductor structure 120 and the shape of the recesses 128. The first conductive layer 165 may be made of a material having good reflectivity. For example, the first conductive layer 165 may include aluminum. When the first conductive layer 165 includes aluminum, the first conductive layer 165 may serve to upwardly reflect light emitted by the active layer 126, thereby enhancing light extraction efficiency.

The junction layer 160 may include a conductive material. For example, the junction layer 160 may include a material selected from a group consisting of gold, tin, indium, aluminum, silicon, silver, nickel, and copper or an alloy thereof.

A substrate 170 may be made of a conductive material. For example, the substrate 170 may include a metal or a semiconductor material. For example, the substrate 170 may be made of a metal having good electrical conductivity and/or thermal conductivity. In this case, heat generated while the semiconductor device operates may be quickly released to the outside.

The substrate 170 may include a material selected from a group consisting of silicon, molybdenum, tungsten, copper, and aluminum or an alloy thereof.

A square wave pattern may be formed on top of the semiconductor structure 120. The square wave pattern may enhance the extraction efficiency of light emitted from the semiconductor structure 120. The square wave pattern may have a different average height depending on ultraviolet wavelengths. For UV-C, the average height ranges from about 300 nm to about 800 nm. When the height ranges from about 500 nm to about 600 nm, it is possible to enhance light extraction efficiency.

Figure 6B:
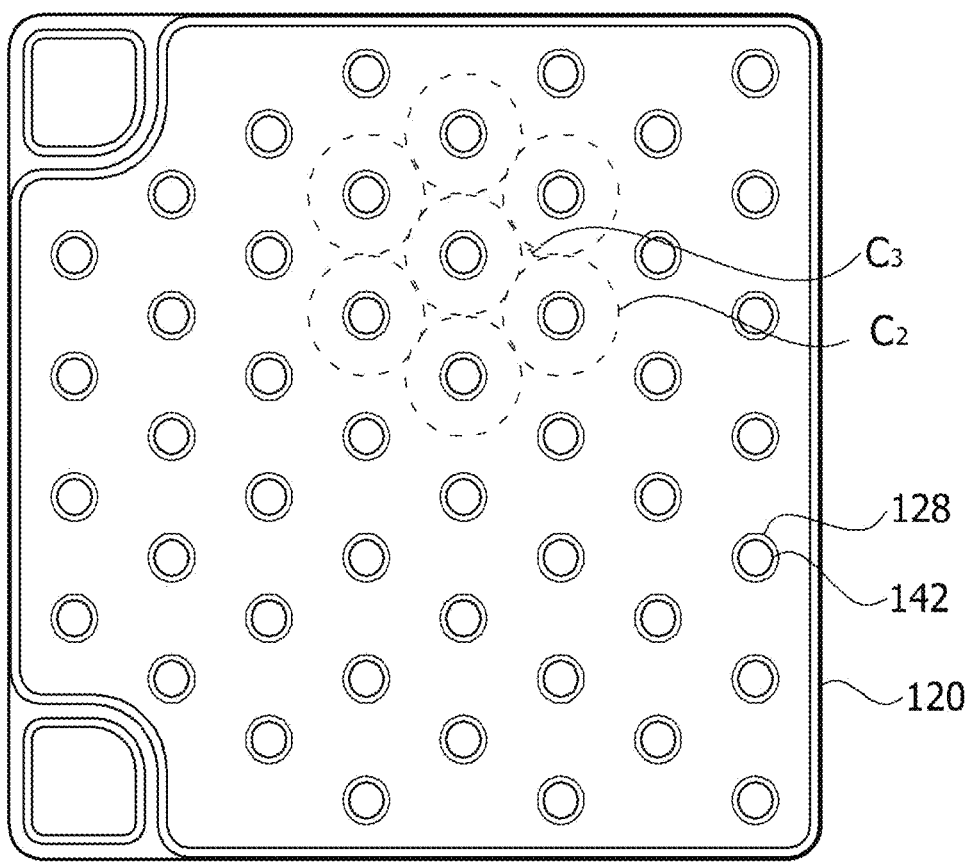

FIGS. 6A and 6B are plan views of a semiconductor device according to an embodiment of the present disclosure.

When the semiconductor structure 120 has an increasing aluminum composition, it is possible for there to be a reduction in electric current spreading characteristics in the semiconductor structure 120. Also, the active layer 126 may have an increasing quantity of light emitted to the side relative to a GaN-based blue light emitting device (TM mode). The TM mode may be performed by an ultraviolet semiconductor device.

According to an embodiment of the present disclosure, a larger number of recesses 128 may be formed on a GaN semiconductor that emits light having an ultraviolet wavelength band than on a GaN semiconductor that emits blue light, and then the first electrode 142 may be provided in each of the recesses 128.

Referring to FIG. 6A, when aluminum composition increases, electric current distribution characteristics may be weakened. Accordingly, an electric current may be distributed only to points adjacent to the first electrode 142, and electric current density may rapidly decrease at points apart from the first electrode 142. Accordingly, it is possible for an effective light emitting region C2 to become narrow. A region up to a boundary having an electric current density of 40% or less with respect to a point adjacent to the first electrode 142 and having the highest electric current density may be defined as the effective light emitting region C2. For example, the effective light emitting region C2 may be adjusted in the range of about 5 μm to about 40 μm from the center of each of the recesses 128 depending on the injected electric current level and aluminum composition.

In particular, a low electric current density region C3, which is a region between adjacent first electrodes 142, has a low electric current density and thus hardly contributes to light emission. Accordingly, according to an embodiment of the present disclosure, a first electrode 142 may be additionally provided in the low electric current density region C3, which has a low electric current density, thereby enhancing optical output power.

Generally, since a GaN semiconductor layer has relatively good electric current distribution characteristics, it is preferable that the areas of the recesses 128 and the first electrodes 142 be minimized. This is because the area of the active layer 126 decreases as the areas of the recess 128 and the first electrode 142 increase. However, according to an embodiment of the present disclosure, the GaN semiconductor layer has lower electric current distribution characteristics than a semiconductor device that emits blue light because of a high aluminum composition. Accordingly, it may be preferable to reduce size of the low electric current density region C3 by increasing the number of first electrodes 142 while reducing the area of the active layer 126.

Referring to FIG. 6B, when the number of recesses 128 is 48, the recesses 128 cannot be straightly arranged in a horizontal or vertical direction and may be arranged in a zigzag form. In this case, since the area of the low electric current density region C3 is further decreased, most of the active layer may participate in light emission. When the number of recesses 128 ranges from about 70 to about 110, an electric current may be efficiently distributed. Thus, it is possible to additionally decrease operating voltage and enhance optical output power. For a semiconductor device that emits UV-C light, when the number of recesses 128 is less than about 70, it is possible to reduce electrical characteristics and optical characteristics. When the number of recesses 128 is greater than about 110, it is possible to enhance electrical characteristics, but there may be a reduction in optical characteristics due to the reduction in volume of the light emitting layer.

A first area in which a plurality of first electrodes 142 are in contact with the first conductive semiconductor layer 124 may range from about 7.4% to about 20% or from about 10% to about 20% of the maximum horizontal sectional area of the semiconductor structure 120. The first area may be the sum of areas in which the first electrodes 142 are in contact with the first conductive semiconductor layer 124.

When the first area of the plurality of first electrodes 142 is greater than or equal to 7.4% of the maximum horizontal sectional area of the semiconductor structure 120, it is possible to have sufficient electric current distribution characteristics and enhance optical output power. When the first area is less than or equal to 20% of the maximum horizontal sectional area of the semiconductor structure 120, it is possible to improve optical output power and operating voltage characteristics by securing areas of the active layer and the second electrodes.

Also, the total area of the plurality of recesses 128 may range from 13% to 30% of the maximum horizontal sectional area of the semiconductor structure 120. When the total area of the recesses 128 does not fall within this range, it may be difficult to keep the total area of the first electrode 142 within the range of about 7.4% to about 20%. Also, this may cause an increase in operating voltage and a decrease in optical output power.

A second area in which the second electrode 246 is in contact with the second conductive semiconductor layer 127 may range from about 35% to about 70% of the maximum horizontal sectional area of the semiconductor structure 120. The second area may be the total area in which the second electrode 246 is in contact with the second conductive semiconductor layer 127.

When the second area is greater than or equal to 35%, it is possible to ensure the area of the second electrode and thus to enhance injection efficiency for second carriers and enhance operating voltage characteristics. Also, when the second area is less than or equal to 70%, it is possible to effectively widen the first area and thus improve injection efficiency for first carriers.

The first area is inversely proportional to the second area. That is, when the number of recesses is increased to increase the number of first electrodes, the area of the second electrode decreases. In order to increase optical output power, the first carriers should be balanced with the second carriers. Thus, it is important to determine an appropriate ratio between the first area and the second area.

Accordingly, in order to control the first carriers and the second carriers injected into the active layer 126 through an appropriate ratio between the first area and the second area, a ratio of the first area in which the plurality of first electrodes are in contact with the first conductive semiconductor layer to the second area in which the second electrode is in contact with the second conductive semiconductor layer (i.e., the first area:the second area) may range from 1:3 to 1:10.

Figure 9:
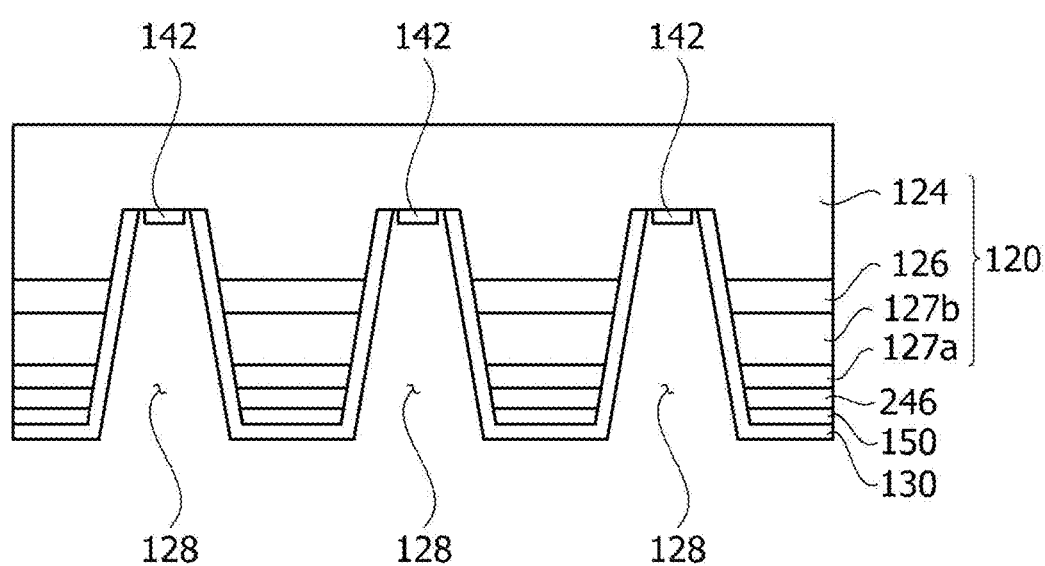
FIG. 9 is a diagram illustrating a semiconductor structure etching process.
Figure 10:
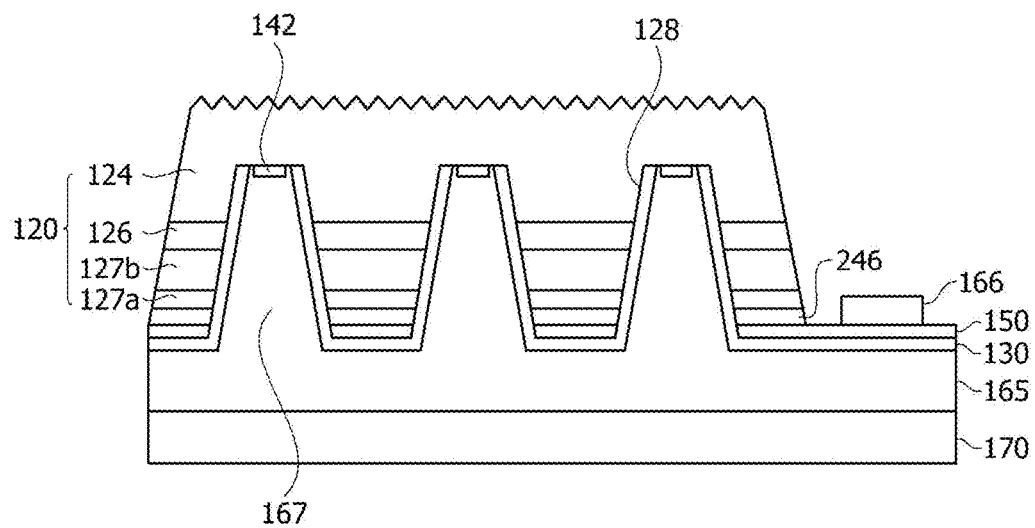
FIG. 10 is a diagram showing a manufactured semiconductor device.

FIG. 7 is a diagram of a semiconductor structure grown on a substrate, FIG. 8 is a diagram illustrating a substrate separation process, FIG. 9 is a diagram illustrating a semiconductor structure etching process, and FIG. 10 is a diagram showing a manufactured semiconductor device.

Referring to FIG. 7, a buffer layer 122, a light absorption layer 123, a first conductive semiconductor layer 124, an active layer 126, a second conductive semiconductor layer 127, a second electrode 246, and a second conductive layer 150 may be sequentially formed on a growth substrate 121.

The light absorption layer 123 includes a first light absorption layer 123*a* having a low aluminum composition and a second light absorption layer 123*b* having a high aluminum composition. A plurality of first light absorption layers 123*a* and a plurality of second light absorption layers 123*b* may be alternately provided.

The first light absorption layer 123*a* may have a lower aluminum composition than the first conductive semiconductor layer 124. The first light absorption layer 123*a* may be separated when absorbing laser light during a laser lift-off (LLO) process. Accordingly, it is possible to remove the growth substrate.

The thickness and aluminum composition of the first light absorption layer 123*a* may be appropriately adjusted to absorb laser light having a predetermined wavelength (e.g., 246 nm). The first light absorption layer 123*a* may have an aluminum composition ranging from about 20% to about 50% and a thickness ranging from about 1 nm to about 10 nm. For example, the first light absorption layer 123*a* may be made of AlGaN, but is not limited thereto.

The second light absorption layer 123*b* may have a higher aluminum composition than the first conductive semiconductor layer 124. Accordingly, it is possible to enhance crystallinity of the first conductive semiconductor layer 124, which is grown on the light absorption layer 123, because a total aluminum composition decreased by the first light absorption layer 123*a* is increased by the second light absorption layer 123*b*.

For example, the second light absorption layer 123*b* may have an aluminum composition ranging from about 60% to about 100% and a thickness ranging from about 0.1 nm to about 2.0 nm. The second light absorption layer 123*b* may be made of AlGaN or AlN.

In order to absorb laser light of 246 nm wavelength, the first light absorption layer 123*a* may be thicker than the second light absorption layer 123*b*. The thickness of the first light absorption layer 123*a* may range from about 1 nm to about 10 nm, and the thickness of the second light absorption layer 123*b* may range from about 0.5 nm to about 2.0 nm.

The thickness ratio of the first light absorption layer 123*a* to the second light absorption layer 123*b* may range from 2:1 to 6:1. When the thickness ratio is less than 2:1, the first light absorption layer 123*a* is so thin that laser light cannot be sufficiently absorbed. When the thickness ratio is greater than 6:1, the second light absorption layer 123*b* is so thin that the total aluminum composition of the light absorption layer may be reduced.

The light absorption layer may have a total thickness greater than about 100 nm and less than about 400 nm. When the thickness is less than about 100 nm, the first light absorption layer 123*a* is so thin that it is difficult to absorb 246 nm laser light. When the thickness is greater than about 400 nm, the total aluminum composition is reduced and thus crystallinity deteriorates.

According to an embodiment of the present disclosure, it is possible to enhance crystallinity by forming the light absorption layer 123 to have a superlattice structure. Due to such a structure, the light absorption layer 123 may function as a buffer layer for alleviating a lattice mismatch between the growth substrate 121 and the semiconductor structure 120.

Referring to FIG. 8, a step of removing the growth substrate 121 may include separating the growth substrate 121 by emitting laser L1 from the side where the growth substrate 121 is present. The laser L1 may have a wavelength band absorbable by the first light absorption layer 123*a*. As an example, the laser may be a KrF laser having a wavelength band of 248 nm.

The growth substrate 121 and the second light absorption layer 123*b* have high energy band gaps and thus do not absorb laser L1. However, the first light absorption layer 123*a* having a low aluminum composition may be disassembled by absorbing laser L1. Accordingly, it is possible to separate the first light absorption layer 123*a* together with the growth substrate 121.

Subsequently, a residual light absorption layer 123-2 on the first conductive semiconductor layer 124 may be removed through a labeling process.

Referring to FIG. 9, after the second conductive layer 150 is formed over the second conductive semiconductor layer 127, a plurality of recesses 128 may be formed to pass through up to a portion of the first conductive semiconductor layer 124 of the semiconductor structure 120. Subsequently, an insulation layer 130 may be formed at the side of each of the recesses 128 and over the second conductive semiconductor layer 127. Subsequently, a first electrodes 142 may be formed on the first conductive semiconductor layer 124 exposed by each of the recesses 128.

Referring to FIG. 10, a first conductive layer 165 may be formed under the insulation layer 130. The first conductive layer 165 may be electrically insulated from the second conductive layer 150 by the insulation layer 130.

Subsequently, a conductive substrate 170 may be formed under the first conductive layer 165, and a second electrode pad 166 may be formed on a portion of the second conductive layer 150 that is exposed through a mesa etching process.

Figure 11:
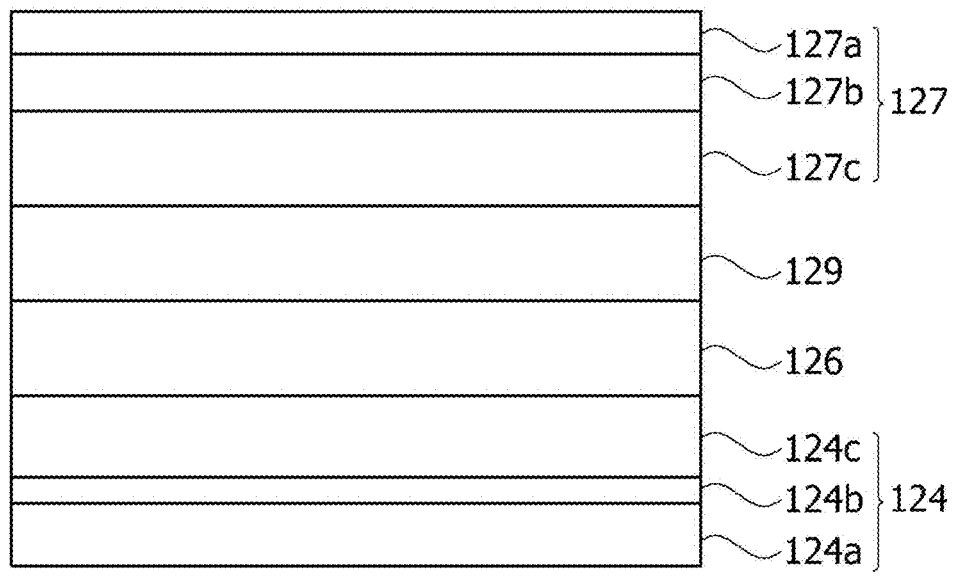
FIG. 11 is a diagram of a semiconductor structure according to the third embodiment of the present disclosure.
Figure 12:
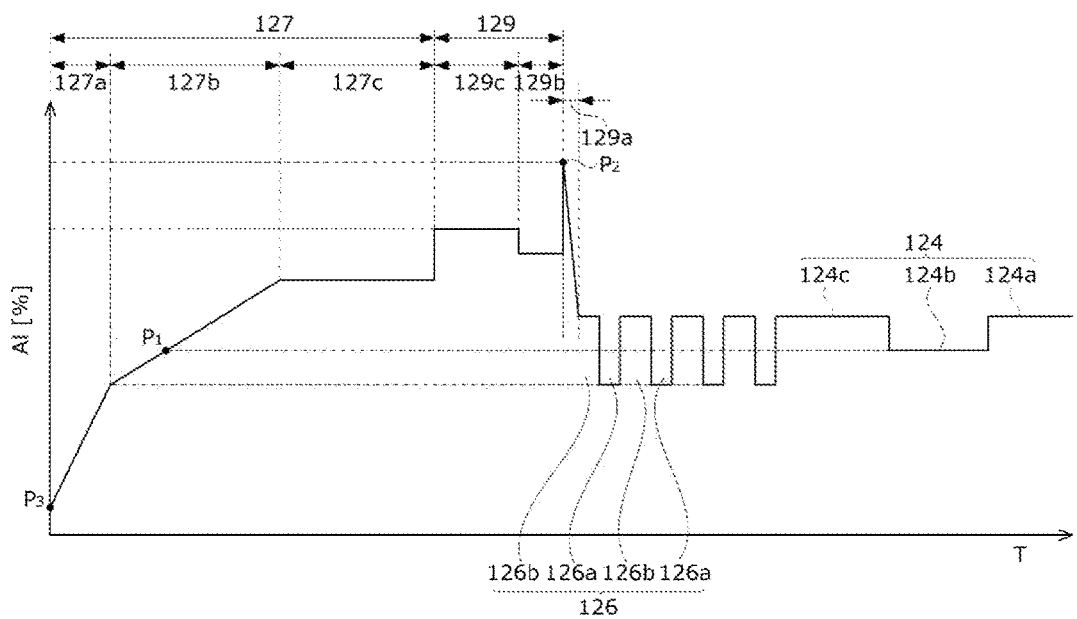
FIG. 12 is a graph showing an aluminum composition of the semiconductor structure according to the third embodiment of the present disclosure.

FIG. 11 is a diagram of a semiconductor structure according to the third embodiment of the present disclosure, and FIG. 12 is a graph showing an aluminum composition of the semiconductor structure according to the third embodiment of the present disclosure Referring to FIG. 11, a semiconductor device according to the embodiment includes a semiconductor structure 120 including a first conductive semiconductor layer 124, a second conductive semiconductor layer 127, and an active layer 126 provided between the first conductive semiconductor layer 124 and the second conductive semiconductor layer 127.

The first conductive semiconductor layer 124 may include a conductive first semiconductor layer 124a, a conductive second semiconductor layer 124c, and an intermediate layer 124b provided between the conductive first semiconductor layer 124a and the conductive second semiconductor layer 124c.

The conductive second semiconductor layer 124c may be provided closer to the active layer 126 than the conductive first semiconductor layer 124a. The conductive second semiconductor layer 124c may have a lower aluminum composition than the conductive first semiconductor layer 124a. The aluminum composition of the conductive second semiconductor layer 124c may range from about 40% to about 70%, and the aluminum composition of the conductive first semiconductor layer 124a may range from about 50% to about 80%.

The conductive second semiconductor layer 124c may be thinner than the conductive first semiconductor layer 124a. The conductive first semiconductor layer 124a may have a thickness ranging from about 130% to about 500% of the thickness of the conductive second semiconductor layer 124c. When the thickness of the conductive first semiconductor layer 124a is smaller than about 130% of the thickness of the conductive second semiconductor layer 124c, the intermediate layer 124b provided on the conductive first semiconductor layer 124a, the conductive second semiconductor layer 124c, or the like may have reduced crystallinity. When the thickness of the conductive first semiconductor layer 124a is greater than about 150%, the semiconductor structure is thick enough to cause stress to be applied to the semiconductor structure that is high enough to crack the semiconductor structure or change the wavelength of emitted light. According to such a configuration, the intermediate layer 124b is formed after the conductive first semiconductor layer 124a, which has a high aluminum composition, is sufficiently grown. Accordingly, it is possible to enhance the overall crystallinity of the semiconductor structure 120 and also adjust the wavelength of emitted light according to the user's desire.

The intermediate layer 124b may have a smaller aluminum composition than the first conductive semiconductor layer 124. The intermediate layer 124b may serve to absorb laser light emitted to the semiconductor structure during an LLO process to prevent damage to the active layer 126. Accordingly, the semiconductor device according to an embodiment of the present disclosure can reduce damage to the active layer, thereby enhancing optical power and electrical characteristics.

The thickness and aluminum composition of the intermediate layer 124b may be appropriately adjusted to absorb laser light emitted to the semiconductor structure 120 during an LLO process. For example, the intermediate layer 124b may have an aluminum composition ranging from about 30% to about 60% and a thickness ranging from about 1 nm to about 10 nm. For example, the intermediate layer 124b may be made of AlGaN, but is not limited thereto.

The intermediate layer 124b may be provided between the first conductive semiconductor layer 124 and the active layer 126. Also, the intermediate layer 124b may include a first intermediate layer having a lower aluminum composition than the first conductive semiconductor layer 124 and a second intermediate layer having a higher aluminum composition than the first conductive semiconductor layer 124. A plurality of first intermediate layers and a plurality of second intermediate layers may be alternately provided.

The active layer 126 may be provided between the first conductive semiconductor layer 124 and the second conductive semiconductor layer 127. The active layer 126 is a layer in which electrons (or holes) injected through the first conductive semiconductor layer 124 are combined with holes (or electrons) injected through the second conductive semiconductor layer 127.

The second conductive semiconductor layer 127 may be formed on the active layer 126 may be made of a group III-V or group II-VI compound semiconductor and may also be doped with a second dopant. The second conductive semiconductor layer 127 may be made of a semiconductor material having an empirical formula $In_{x5}Al_{y2}Ga_{1-x5-y2}N$ ($0 \leq x5 \leq 1$, $0 \leq y2 \leq 1$, and $0 \leq x5+y2 \leq 1$) or a material selected from among AlInN, AlGaAs, GaP, GaAs, GaAsP, and AlGaInP. When the second dopant is a p-type dopant such as Mg, Zn, Ca, Sr, and Ba, the second conductive semiconductor layer 127 doped with the second dopant may be a p-type semiconductor layer.

The second conductive semiconductor layer 127 may include a conductive first semiconductor layer 127a (or a first sublayer), a conductive second semiconductor layer 127b (or a second sublayer), and a conductive third semiconductor layer 127c. The conductive first semiconductor layer 127a (or the first sublayer) may have a lower aluminum composition than the conductive second semiconductor layer 127b (or the second sublayer).

A blocking layer 129 may be provided between the active layer 126 and the second conductive semiconductor layer 127. The blocking layer 129 may block first carriers (e.g., electrons) supplied from the first conductive semiconductor layer 124 from flowing out to the second conductive semiconductor layer 127.

Referring to FIG. 12, the first conductive semiconductor layer 124, the active layer 126, the second conductive semiconductor layer 127, and the blocking layer 129 may all include aluminum. Accordingly, the first conductive semiconductor layer 124, the active layer 126, the second conductive semiconductor layer 127, and the blocking layer 129 may have an AlGaN composition.

The blocking layer 129 may have an aluminum composition ranging from about 50% to about 100%. When the aluminum composition of the blocking layer 129 is less than about 50%, an energy barrier for blocking electrons may be insufficient in height, and the blocking layer 129 may absorb light emitted from the active layer 126.

The blocking layer 129 may include a first section 129a and a second section 129c. The blocking layer 129 may include a second dopant. The second dopant may include a p-type dopant such as Mg, Zn, Ca, Sr, and Ba. When the blocking layer 129 includes a second dopant, the blocking layer 129 may include a dopant that is identical to that of the second conductive semiconductor layer. However, the present disclosure is not limited thereto, and the blocking layer 129 may have the same polarity as the second conductive semiconductor layer 127 and may include a second dopant that is different from that of the second conductive semiconductor layer. By using the first section 129a and the second section 129c, it is possible to increase injection efficiency for second carriers (e.g., holes) and reduce resistance, thereby improving the operating voltage Vf. However, the present disclosure is not limited thereto, and the blocking layer 129 may not include a dopant. The first section 129a may have an aluminum composition increasing toward the second conductive semiconductor layer 127. The region of highest aluminum composition in the first section 129a may have an aluminum composition ranging from about 80% to about 100%. That is, the first section 129a may be made of AlGaN or AlN. Alternatively, the first section 129a may be a superlattice layer in which AlGaN and AlN are alternately provided.

The first section 129a may have a thickness ranging from about 0.1 nm to about 4 nm. When the first section 129a has a thickness of less than about 0.1 nm and/or when the region of highest aluminum composition in the first section 129a has an aluminum composition of less than 80%, it may not be possible to efficiently block the movement of first carriers (e.g., electrons). Also, when the first section 129a has a thickness greater than about 4 nm, it is possible for there to be a reduction in the efficiency with which second carriers (e.g., holes) are injected into the active layer.

Together with the first section 129a, the second section 129c may serve to efficiently block movement of the first carriers (e.g., electrons). The second section 129c may include a second dopant in order to enhance injection of second carriers (e.g., holes). The second dopant may include a p-type dopant such as Mg, Zn, Ca, Sr, and Ba. The second section 129c may have a thickness ranging from about 15 nm to about 30 nm. When the thickness is less than about 15 nm, it may not be possible to efficiently block movement of first carriers (e.g., electrons). Also, when the thickness is greater than about 30 nm, it is possible for there to be a reduction in the efficiency with which second carriers (e.g., holes) are injected into the active layer.

An undoped section 129b, which is not doped with Mg, may be provided between the first section 129a and the second section 129c. The undoped section 129b may serve to prevent a dopant included in the second conductive semiconductor layer 127 from diffusing from the second conductive semiconductor layer 127 to the active layer 126. The undoped section 129b may have a thickness ranging from about 10 nm to about 15 nm. When the thickness is less than about 10 nm, it may be difficult to prevent a dopant from diffusing to the active layer 126. When the thickness is greater than about 15 nm, it is possible for there to be a reduction in the efficiency with which second carriers (e.g., holes) are injected.

The second conductive semiconductor layer 127 may include a conductive first semiconductor layer 127a, a conductive second semiconductor layer 127b, and a conductive third semiconductor layer 127c.

The conductive second semiconductor layer 127b may have a thickness greater than about 10 nm and less than about 50 nm. For example, the second semiconductor layer 127b may have a thickness equal to about 25 nm. When the conductive second semiconductor layer 127b has a thickness less than about 10 nm, it is possible to reduce electric current injection efficiency because of a horizontal increase in resistance. When the conductive second semiconductor layer 127b has a thickness greater than about 50 nm, it is possible for there to be a reduction in electric current injection efficiency because of an increase in resistance in the horizontal direction.

The conductive second semiconductor layer 127b may have a higher aluminum composition than the well layer 126a. In order to generate ultraviolet light, the well layer 126a may have an aluminum composition ranging from about 30% to about 70%. When the conductive second semiconductor layer 127b has a lower aluminum composition than the well layer 126a, it is possible for there to be a reduction in light extraction efficiency because the conductive second semiconductor layer 127b absorbs light. However, the present disclosure is not limited thereto. For example, in some sections, the conductive second semiconductor layer 127b may have a lower aluminum composition than the well layer 126a.

The conductive second semiconductor layer 127b may have an aluminum composition greater than about 40% and less than about 80%. When the aluminum composition of the conductive second semiconductor layer 127b is less than about 40%, light may be absorbed. When the aluminum composition of the conductive second semiconductor layer 127b is greater than about 80%, electric current injection efficiency may deteriorate. For example, when the well layer 126a has an aluminum composition of about 30%, the conductive second semiconductor layer 127b may have an aluminum composition of about 40%.

The conductive first semiconductor layer 127a may have a lower aluminum composition than the well layer 126a. When the conductive first semiconductor layer 127a has a higher aluminum composition than the well layer 126a, the conductive first semiconductor layer 127a is not sufficiently ohmic with a second electrode due to an increase in resistance therebetween, and electric current injection efficiency is also reduced.

The conductive first semiconductor layer 127a may have an aluminum composition greater than about 1% and less than about 50%. When the aluminum composition is greater than about 50%, the conductive first semiconductor layer 127a may not be sufficiently ohmic with the second electrode. When the aluminum composition is less than about 1%, the composition is close to GaN, and thus the conductive first semiconductor layer 127a absorbs light.

The conductive first semiconductor layer 127a may have a thickness ranging from about 1 nm to about 30 nm or ranging from about 1 nm to about 10 nm. As described above, the conductive first semiconductor layer 127a may absorb ultraviolet light because the conductive first semiconductor layer 127a has an aluminum composition low enough to be ohmic. Accordingly, it may be advantageous in terms of optical output power to control the conductive first semiconductor layer 127a to be as thin as possible.

However, when the thickness of the conductive first semiconductor layer 127a is controlled to be less than or equal to about 1 nm, it is possible for there to be a reduction in crystallinity due to a change in aluminum composition. Also, the conductive first semiconductor layer 127a is so thin that horizontal resistance of the conductive first semiconductor layer 127a may increase and the electrical characteristics of the semiconductor device may decrease. Also, when the thickness is greater than about 30 nm, the absorbed light quantity is large enough that optical output power efficiency may decrease.

The conductive first semiconductor layer 127a may have a smaller thickness than the conductive second semiconductor layer 127b. The thickness ratio of the conductive second semiconductor layer 127b to the conductive first semiconductor layer 127a may range from 1.5:1 to 20:1. When the thickness ratio is less than 1.5:1, the conductive second semiconductor layer 127 is thin enough that the electric current injection efficiency may decrease. When the thickness ratio is greater than 20:1, the conductive first semiconductor layer 127a is thin enough that crystallinity may be reduced and the electrical characteristics of the semiconductor device may be reduced.

The conductive second semiconductor layer 127b may have an aluminum composition decreasing away from the active layer 126. Also, the conductive first semiconductor layer 127a may have an aluminum composition decreasing away from the active layer 126.

In this case, the conductive first semiconductor layer 127a may have a greater reduction in aluminum composition than the conductive second semiconductor layer 127b. That is, the conductive first semiconductor layer 127a may have a greater variation in aluminum composition in the direction of thickness than the conductive second semiconductor layer 127b.

The conductive second semiconductor layer 127b is thicker than the conductive first semiconductor layer 127a and has a higher aluminum composition than the well layer 126a, and thus may have a relatively low reduction in aluminum composition. However, since the conductive first semiconductor layer 127a is thin and has a large change in aluminum composition, a reduction in aluminum composition may be relatively large. Since the conductive first semiconductor layer 127a is thin and has a large change in aluminum composition, it is possible to change the aluminum composition while relatively slowly growing the conductive first semiconductor layer 127a.

The conductive third semiconductor layer 127c may have a uniform aluminum composition. The conductive third semiconductor layer 127c may have a thickness ranging from about 20 nm to about 60 nm. The conductive third semiconductor layer 127c may have an aluminum composition ranging from about 40% to about 70%. When the aluminum composition of the conductive third semiconductor layer 127c is greater than or equal to about 40%, it is possible for there to be a reduction in crystallinity of the conductive first semiconductor layer 127a and the conductive second semiconductor layer 127b. When the aluminum composition is less than about 70%, it is possible to prevent reduction of the crystallinity due to a rapid change in aluminum composition of the conductive first semiconductor layer 127a and the conductive second semiconductor layer 127b. Thus, it is possible to enhance the electrical characteristics of the semiconductor device.

As described above, the conductive first semiconductor layer 127a may have a thickness ranging from about 1 nm to about 10 nm, the conductive second semiconductor layer 127b may have a thickness ranging from about 10 nm to about 50 nm, and the conductive third semiconductor layer 127c may have a thickness ranging from about 20 nm to about 60 nm. Accordingly, the ratio of the thickness of the conductive first semiconductor layer 127a to the total thickness of the second conductive semiconductor layer 127 may range from 1:3 to 1:120. When the ratio is greater than 1:3, the conductive first semiconductor layer 127a may ensure the electrical characteristics (e.g., an operating voltage) of the semiconductor device. When the ratio is less than 1:120, the conductive first semiconductor layer 127a may ensure the optical characteristics (e.g., optical output power) of the semiconductor device. However, the present disclosure is not limited thereto, and the ratio of the thickness of the conductive first semiconductor layer 127a to the total thickness of the second conductive semiconductor layer 127 may range from 1:3 to 1:150 or range from 1:3 to 1:70.

Figure 13:
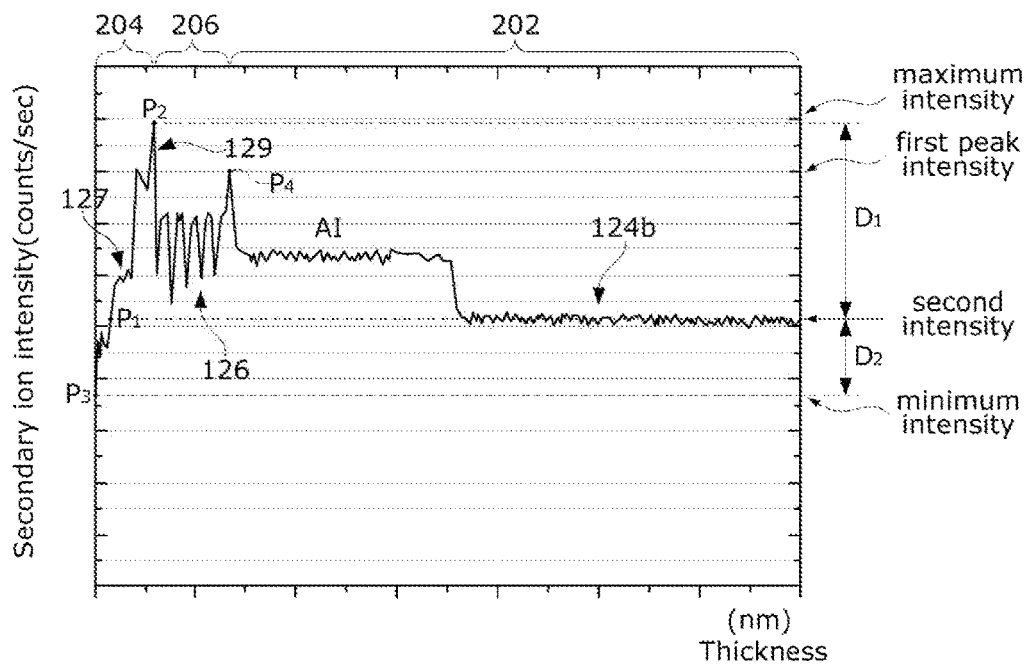
FIG. 13 is a secondary ion mass spectrometry (SIMS) graph showing a change in aluminum strength of the semiconductor structure according to the third embodiment of the present disclosure.
Figure 14:
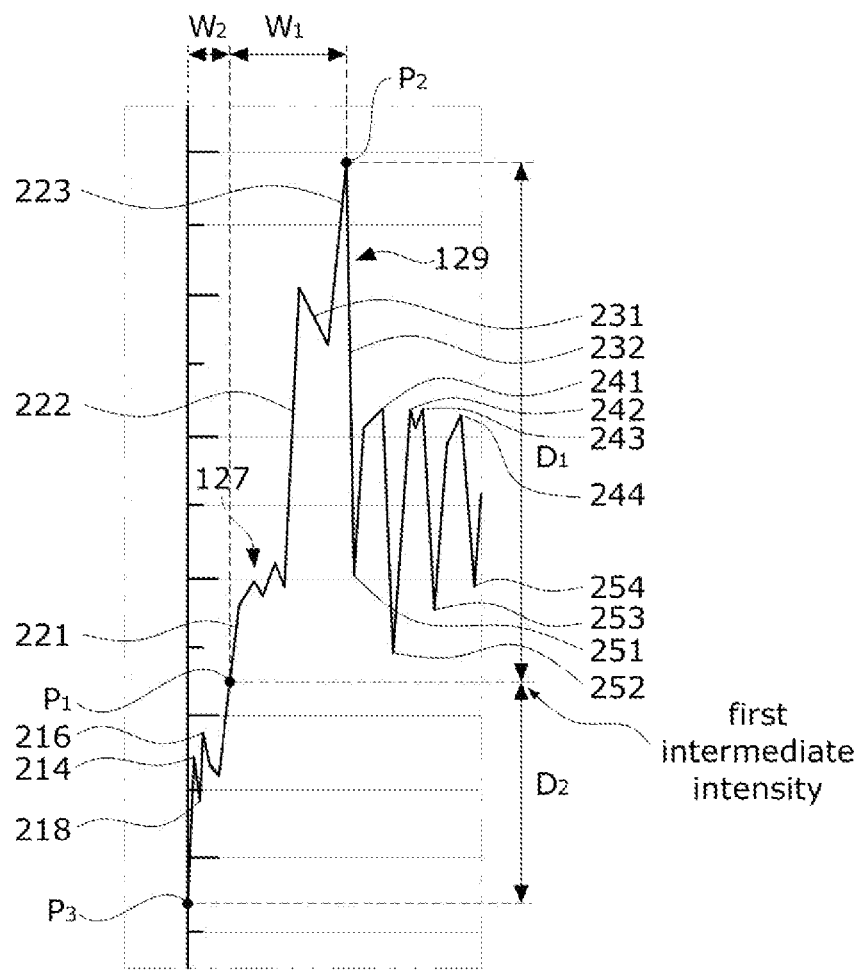
FIG. 14 is a partially enlarged view of FIG. 13.
Figure 15:
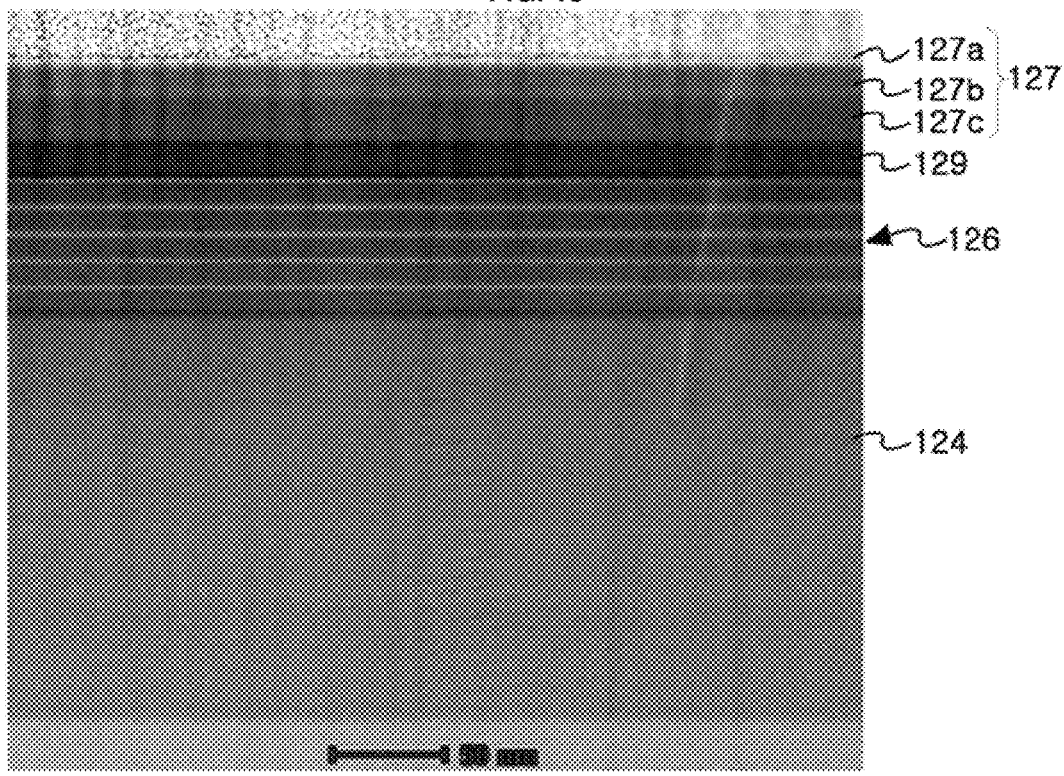
FIG. 15 is a photograph of the semiconductor structure according to the third embodiment of the present disclosure.
Figure 16:
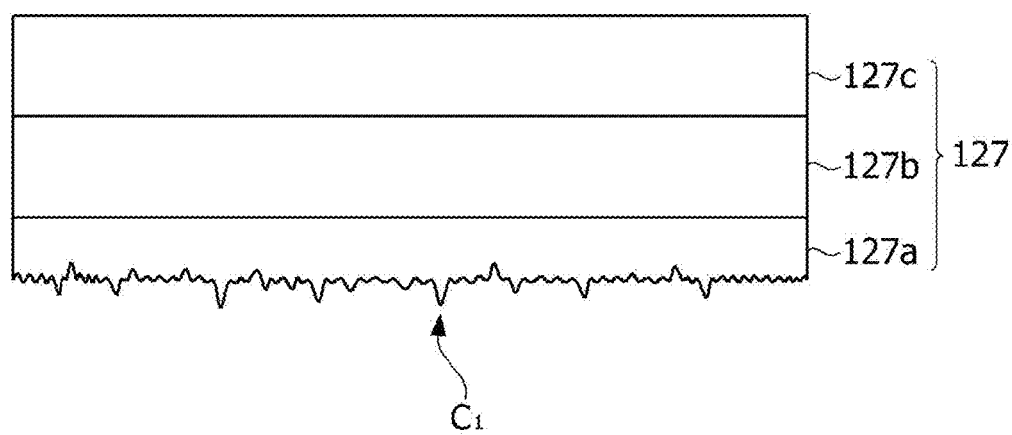
FIG. 16 is a diagram of a second conductive semiconductor layer according to the first embodiment of the present disclosure.

FIG. 13 is a secondary ion mass spectrometry (SIMS) graph showing the change in aluminum strength of the semiconductor structure according to the third embodiment of the present disclosure, and FIG. 14 is a partially enlarged view of FIG. 13.

Referring to FIGS. 13 and 14, the semiconductor structure may have aluminum ion strength that changes from the first conductive semiconductor layer 124 to the second conductive semiconductor layer 127.

SIMS data may be analyzed through Time-of-Flight secondary ion mass spectrometry (TOF-SIMS).

SIMS data may be analyzed by emitting primary ions to a target surface and counting the number of secondary ions discharged. In this case, the primary ions may be selected from among $O_2^+$, $Cs^+$, $Bi^+$, and so on, an acceleration voltage may be adjusted between the range of about 20 keV to about 30 KeV, an emitted current may be adjusted between the range of about 0.1 pA to about 5.0 pA, and a target area may be 20 nm×20 nm.

SIMS data may be obtained by collecting a secondary ion mass spectrum while gradually etching a surface of the second conductive semiconductor layer in a direction toward the first conductive semiconductor layer. Here, the secondary ions may each be an aluminum ion. In this case, a spectrum of aluminum ion strength may be expressed on a linear scale, but the present disclosure is not limited thereto. The spectrum may also be expressed on a log scale.

The semiconductor structure may have a first point P1 with the lowest aluminum ion strength in the first conductive semiconductor layer 124, a second point P2 with the highest aluminum ion strength in the blocking layer, and a third point P3 with the lowest aluminum ion strength in the second conductive semiconductor layer 127. However, the present disclosure is not limited thereto, and the point of highest aluminum ion strength and the point of lowest aluminum ion strength in the semiconductor structure may be different from those described above.

The first point P1 (having a second intensity) may be positioned in the intermediate layer 124b that is provided in the first conductive semiconductor layer, and may be a region that is in contact with the first electrode 142. The second point P2 (having a maximum intensity) may be positioned in the first section 129a of the blocking layer 129. The third point P3 (having a minimum intensity) may be positioned in a contact layer (the conductive first semiconductor layer) where the second conductive semiconductor layer is in direct contact with the second electrode (a P-ohmic electrode). The first conductive semiconductor layer may have a first region 202 having the intensity of secondary ions be between a first peak intensity (at a fourth point P4) and the second intensity. The second conductive semiconductor layer may have a second region 204 having the intensity of secondary ions be between the maximum intensity (at the second point P2) and the minimum intensity (at the third point P3). A third region 206 may have the intensity of secondary ions be between the maximum intensity (at the second point P2) and the first peak intensity.

When the first point P1, the second point P2, and the third point P3 are measured through SIMS, a semiconductor layer of a certain thickness or greater may include noise. For example, the first point P1 may be defined as a layer having the same strength as a layer having low aluminum ion strength in the first conductive semiconductor layer. In this case, noise at the first point P1 may be 2% or less of the difference between the high point and the low point The ratio of the difference in aluminum strength between the first point P1 and the second point P2, called first intensity difference D1, to the difference in aluminum strength between the first point P1 and the third point P3, called second intensity difference D2, (i.e., D1:D2) may range from 1:0.2 to 1:2.

When the ratio is greater than 1:0.2, it is possible to sufficiently ensure the second intensity difference D2 (or second aluminum strength difference), thus improving contact resistance between the second conductive semiconductor layer and the second electrode.

When the ratio is less than or equal to 1:2, by preventing a relative increase in the second intensity difference D2 (or second aluminum strength difference), it is possible to adjust the change in aluminum strength with respect to the thickness of the conductive first semiconductor layer 127a such that the change does not become too large Accordingly, it is possible to improve crystallinity of the semiconductor structure and improve transmittance of the conductive first semiconductor layer 127a with respect to light emitted by the active layer 126 to enhance the optical characteristics of the semiconductor device.

On the other hand, when a thin GaN layer (a surface layer) is inserted for the purpose of ohmic contact between the second conductive semiconductor layer and an electrode, the GaN layer that is in contact with the electrode does not include aluminum. Thus it is possible to rapidly increase the second intensity difference D2 (or second aluminum strength difference). Accordingly, the ratio of the first intensity difference D1 (or first aluminum strength difference) to the second intensity difference D2 (D1:D2) may depart from the range of 1:0.2 to 1:2.

The ratio between the first thickness W1 of the semiconductor structure to the second thickness W2 of the semiconductor structure (W1:W2) may range from 1:0.2 to 1:1. The first thickness W1 may be the thickness of the semiconductor structure between the first point P1 and the second point P2 positioned in the second conductive semiconductor layer 127, and the second thickness W2 may be the thickness of the semiconductor structure between the first point P1 and the third point P3 positioned in the second conductive semiconductor layer 127. FIG. 14 also shows that at a first prescribed distance 280 (corresponding to the second thickness) from a surface of the second conductive semiconductor layer 127, the second conductive semiconductor layer 127 exhibits a first intermediate intensity of the secondary ions corresponding to the second intensity, which is between the minimum intensity and the maximum intensity. FIG. 14 also shows that the maximum intensity occurs at a second prescribed distance 285 (corresponding to the first thickness) from the first prescribed distance 280.

When the ratio of the first thickness W1 to the second thickness W2 (W1:W2) is greater than or equal to 1:0.2, it is possible to improve crystallinity by ensuring the second thickness W2.

Also, when the ratio of the first thickness W1 to the second thickness W2 is less than or equal to 1:1, it is possible to relatively reduce the second thickness W2. Accordingly, it is possible to improve light extraction efficiency by alleviating the problem of light emitted by the active layer 126 being absorbed inside the second thickness W2.

FIG. 14 shows a partially enlarged view of FIG. 13. As shown in FIG. 14, the intensity exhibited in the second conductive semiconductor layer 127 between the minimum intensity (at the third point P3) and the first intermediate intensity (at the first point P1) includes a plurality of intensity peaks 214, 216 and an intensity valley 218 between the intensity peaks 214, 216.

FIGS. 13-14 show a plurality of peak intensities within the graph. As specifically shown, a peak intensity (of the secondary ions) may be formed based on an increasing intensity (of secondary ions) that transitions to a decreasing intensity (of secondary ions). A peak intensity may also be formed based on a decreasing intensity that transitions to an increasing intensity. The increasing intensity of the secondary ions may be considered an increasing region (such as one of the increasing intensities 221, 222, 233), and the decreasing intensity of the secondary ions may be considered a decreasing region (such as one of the decreasing intensities 231, 232). As one example, the peak intensities include the first peak intensity (at the fourth point P4), a plurality of sub peaks 241, 242, 243,244, and a plurality of sub valleys 252, 253, 254. The graph shown in FIGS. 13-14 may include others ones of the increasing regions, decreasing regions, sub peaks and/or sub valleys.

Figure 18:
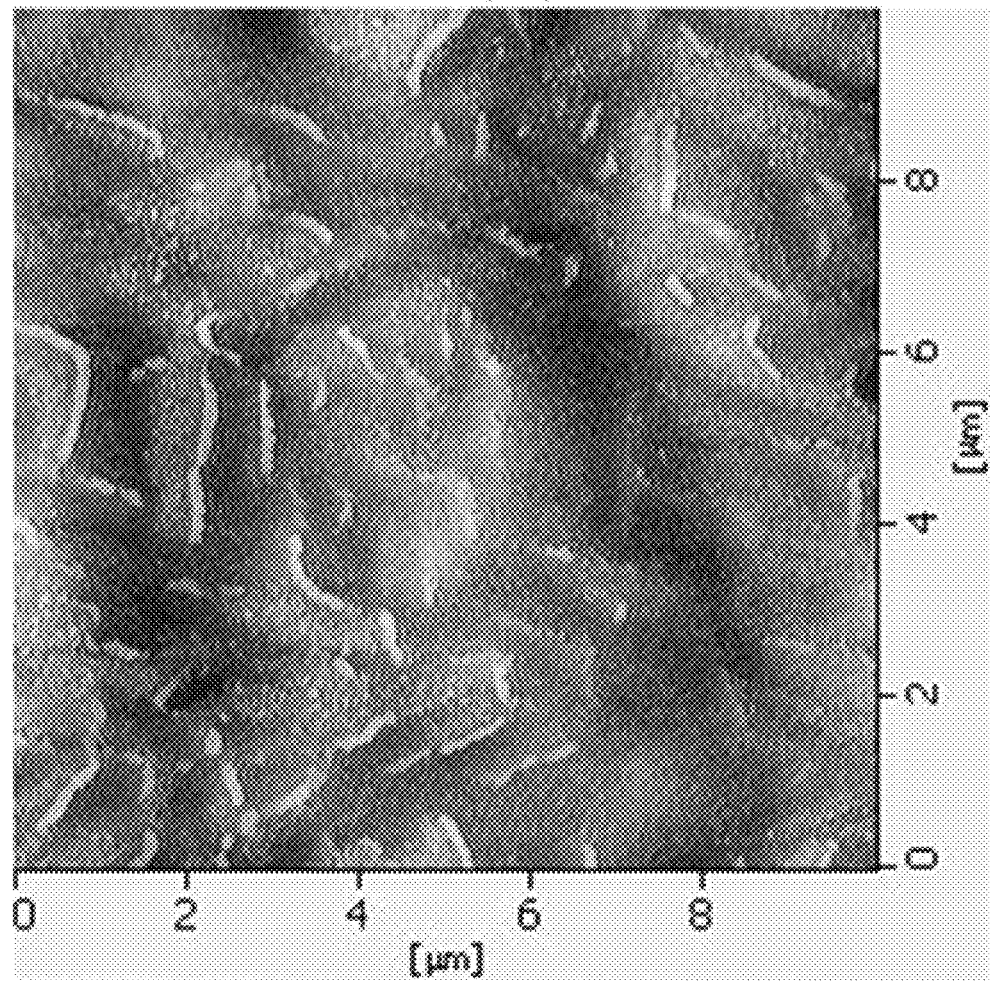
FIG. 18 shows AFM data obtained by measuring the surface of a GaN thin film.

Referring to FIG. 18, a second conductive semiconductor layer 127 according to an embodiment of the present disclosure may include a 2-1 conductive semiconductor layer 127a, a conductive second semiconductor layer 127b, and a conductive third semiconductor layer 127c. The conductive first semiconductor layer 127a may be a contact layer that is in contact with the second electrode. As features of the layers, the above-description may be applied as it is.

The surface of the conductive first semiconductor layer 127a may include a plurality of clusters C1. Each of the clusters C1 may be a protrusion protruding from the surface. For example, each of the clusters C1 may be a protrusion protruding more than about 10 nm or 20 nm from the average surface height. Each of the clusters C1 may be formed due to a lattice mismatch between aluminum Al and gallium Ga.

The conductive first semiconductor layer 127a includes aluminum, has a large variation in thickness of aluminum, and is thinner than other layers. Thus, the surface may be formed not in a single layer but in the form of clusters C1. Each of the clusters C1 may include Al, Ga, N, Mg, or the like. However, the present disclosure is not limited thereto.

Figure 17:
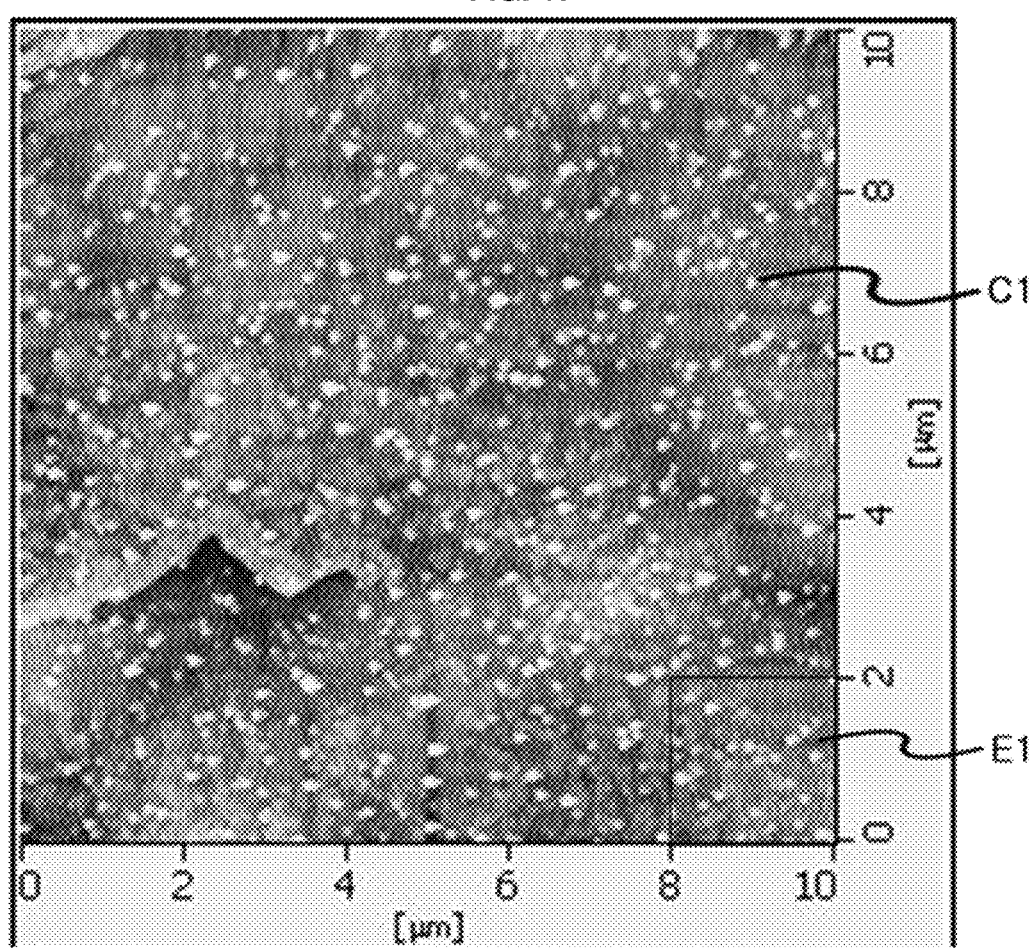
FIG. 17 shows AFM data obtained by measuring the surface of a second conductive semiconductor layer according to the third embodiment of the present disclosure.

Referring to FIG. 17, clusters C1 formed in the shape of relatively bright dots may be seen from the surface of the second conductive semiconductor layer 127. According to an embodiment of the present disclosure, since the conductive first semiconductor layer 127a has an aluminum composition ranging from about 1% to about 10%, the surface may be generated in the form of clusters C1 to increase contact area. Accordingly, it is possible to enhance electrical characteristics.

100 to 800 clusters C1 may be observed per average 100 µm² in the surface of the second conductive semiconductor layer 127. Here, the average value is the average of values measured at about 10 or more different positions. The result obtained by measuring position E1 of FIG. 17 was 12 clusters C1 observed per unit area, which is 2 µm×2 µm. Only clusters protruding more than 25 nm from the surface were measured as the clusters C1. By adjusting contrast in an AFM image, it is possible to ensure that only clusters protruding more than 25 nm from the surface may be output.

The clusters C1, using converted units based on the measurement results, may have a density ranging from $1 \times 10^{-8}/cm^2$ to $8 \times 10^{-6}/cm^2$. When the density of the clusters C1 is greater than or equal to $1 \times 10^{-8}/cm^2$, the contact area may relatively increase, and contact resistance with the second electrode may decrease.

Also, when the density of the clusters C1 is less than or equal to $8 \times 10^{-6}/cm^2$, it is possible to alleviate the problem of light emitted by the active layer 126 being absorbed by Ga included in some of the clusters. Accordingly, it is possible to improve optical output power.

According to an embodiment of the present disclosure, the density of the clusters C1 may satisfy $1 \times 10^{-8}/cm^2$ to $8 \times 10^{-6}/cm^2$, and thus it is possible to decrease contact resistance with the second electrode while not reducing the optical output power.

Referring to FIG. 18, it can be seen that no cluster was observed from the surface of a GaN thin film. This is because the surface is formed in a single layer as the density of the clusters increases. Accordingly, it can be seen that no cluster is formed on the contact surface when a GaN thin film is formed between the second conductive semiconductor layer and the second electrode. Accordingly, when a GaN-based semiconductor material including aluminum such as AlGaN is provided on the surface of the semiconductor structure, the clusters C1 may be formed on the surface of the semiconductor structure.

Figure 19:
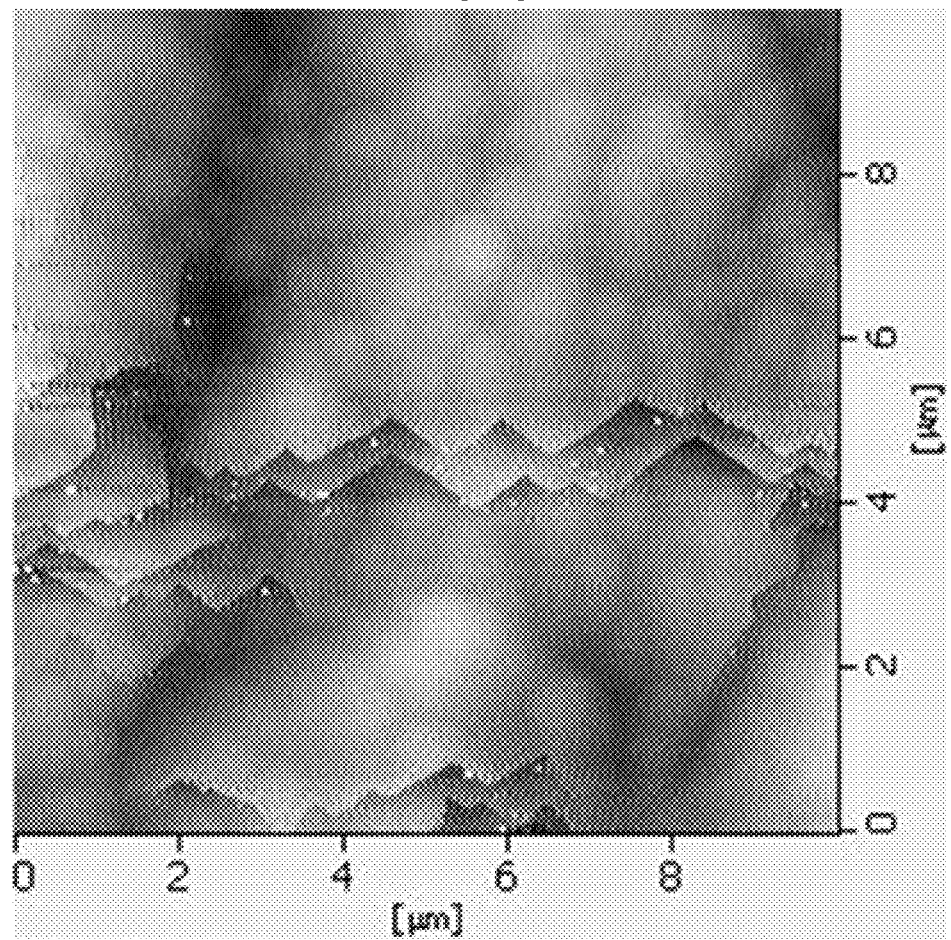
FIG. 19 shows AFM data obtained by measuring the surface of a fast-grown P—AlGaN layer.

Referring to FIG. 19, it can be seen that clusters are not grown well when the second conductive semiconductor layer is fast-grown. Accordingly, it can be seen that no clusters C1 are formed when the second conductive semiconductor layer is fast-grown although the second conductive semiconductor layer is controlled such that the aluminum composition of the surface of the second conductive semiconductor layer ranges from about 1% to about 10%. For example, FIG. 19 is a photograph obtained by measuring the surface after P—AlGaN is grown at a speed of 0.06 nm/s.

That is, it can be seen that a contact layer should have an aluminum composition ranging from about 1% to about 10% and also a sufficiently low growth speed in order to form a plurality of clusters C1 in the second conductive semiconductor layer 127.

Figure 20:
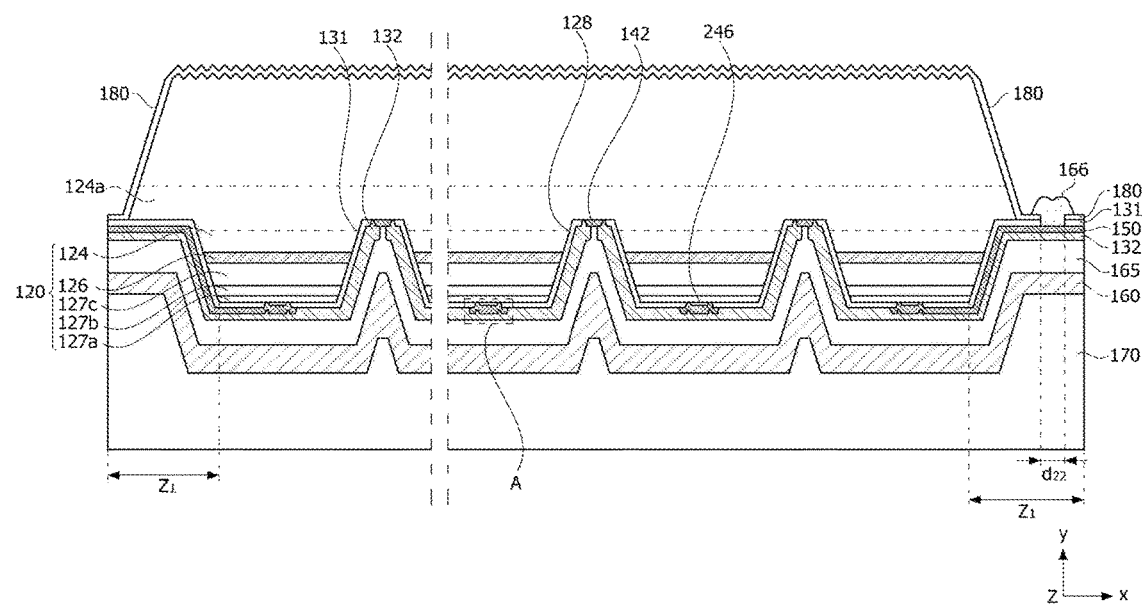
FIG. 20 is a diagram of a semiconductor device according to the third embodiment of the present disclosure.
Figure 21A:
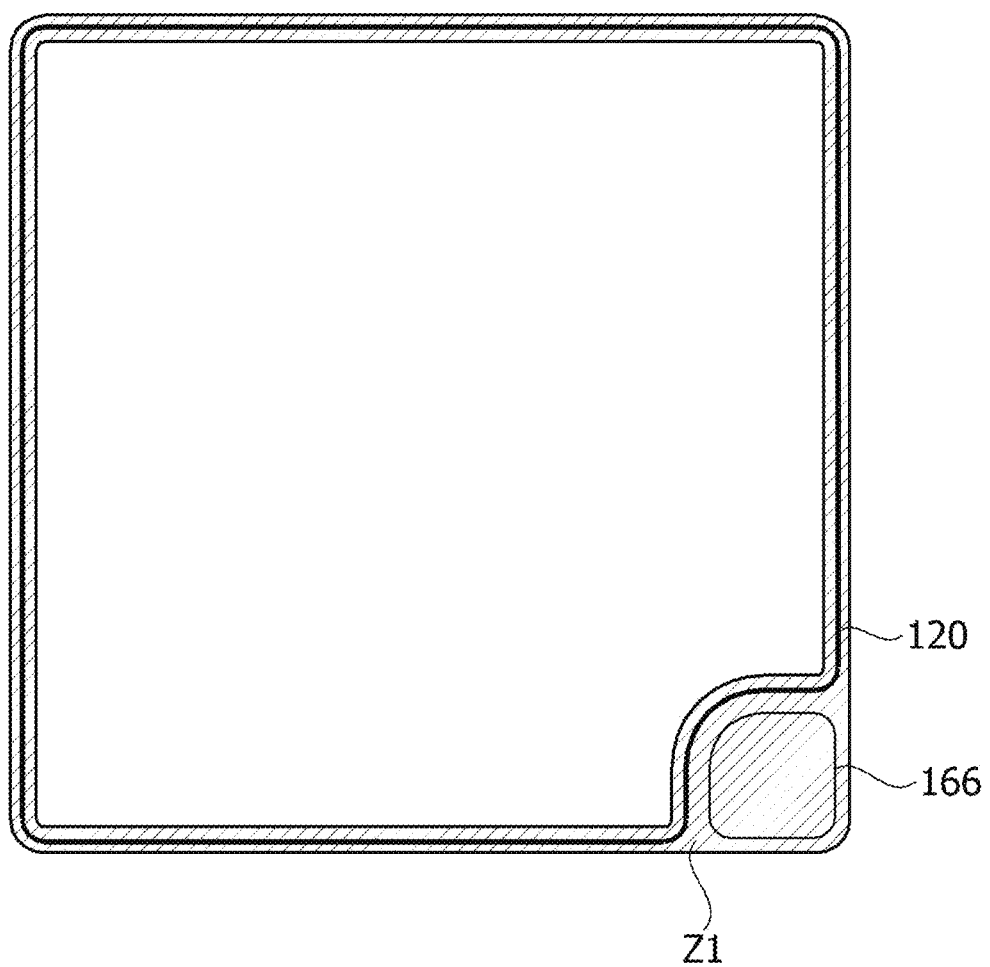
FIG. 21A is a plan view of FIG. 20.
Figure 22:
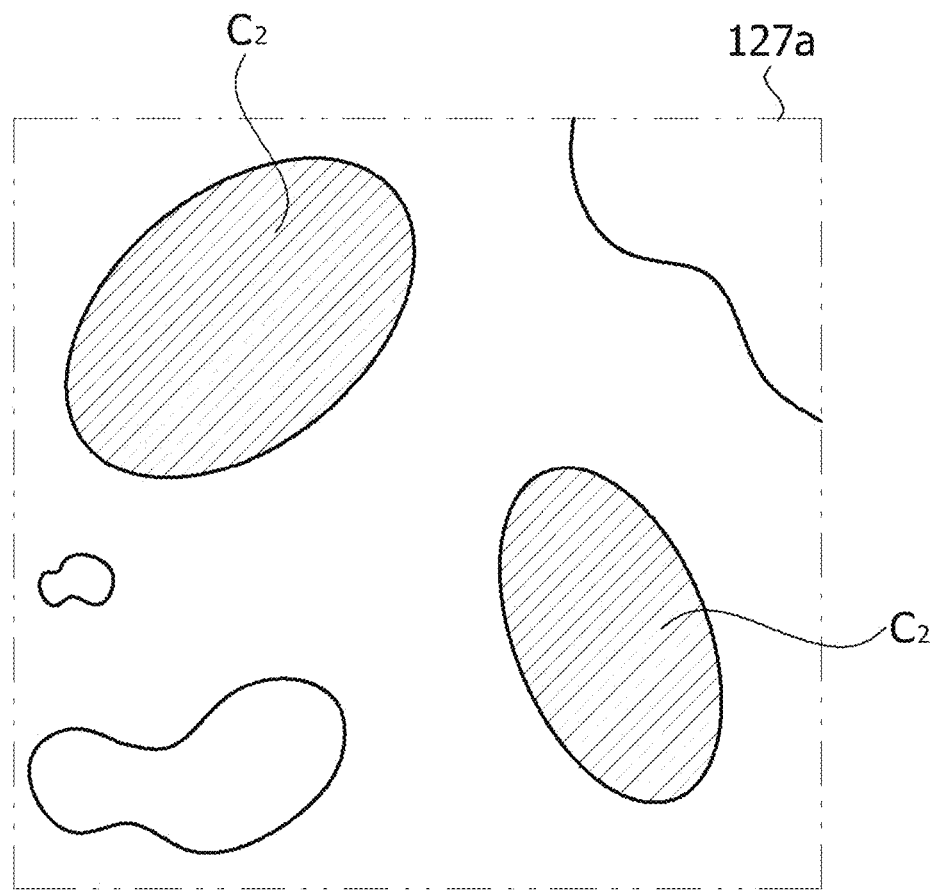
FIG. 22 is a plan view illustrating an interface between a second conductive semiconductor layer and a second electrode.

According to an embodiment of the present disclosure, the conductive first semiconductor layer may have a lower growth speed than the conductive second semiconductor layer and the conductive third semiconductor layer. For example, the ratio of the growth speed of the conductive second semiconductor layer and the conductive first semiconductor layer may range from 1:0.2 to 1:0.8. When the growth speed ratio is less than 1:0.2, the growth speed of the conductive first semiconductor layer is so low that AlGaN having a high aluminum composition may be grown by Ga being etched at the same high temperature at which the AlGaN is grown, and thus reducing ohmic characteristics. When the growth speed ratio is greater than 1:0.8, the growth speed of the conductive first semiconductor layer is so high that the crystallinity may be reduced. FIG. 20 is a diagram of a semiconductor device according to the third embodiment of the present disclosure, FIG. 21A is a plan view of FIG. 20, FIG. 21B is a view enlarging a portion A of FIG. 20, and FIG. 22 is a plan view illustrating a portion of an interface between the second conductive semiconductor layer and the second electrode.

Referring to FIG. 20, a semiconductor structure 120 may have a configuration of the above-described semiconductor structure 120 applied as it is. A plurality of recesses 128 may be provided even in a portion of a first conductive semiconductor layer 124 through a second conductive semiconductor layer 127 and an active layer 126.

The semiconductor device may include a side reflector Z1 provided on an edge thereof. The side reflector Z1 may be formed by a second conductive layer 150, a first conductive layer 165, and a substrate 170 protruding in the direction of thickness (a y-axis direction). Referring to FIG. 21A, the side reflector Z1 may be provided along the edge of the semiconductor device to surround the semiconductor structure.

The second conductive layer 150 of the side reflector Z1 protrudes further than the active layer 126 so that the second conductive layer 150 may upwardly reflect light L2 emitted by the active layer 126. Accordingly, without a separate reflective layer being formed, it is possible to reflect light emitted in a horizontal direction (an x-axis direction) upward at the outermost portion because of the TM mode.

The side reflector Z1 may have a slope angle greater than about 90 degrees and less than about 145 degrees. The slope angle may be an angle between the second conductive layer 150 and the horizontal plane (an XZ plane). When the angle is less than about 90 degrees or greater than about 145 degrees, it is possible for there to be a reduction in the efficiency with which light traveling toward the side is reflected upward.

Referring to FIG. 21B, a second electrode 246 may be in direct contact with a 2-1 conductive semiconductor layer 127a. As described above, clusters may be provided on the surface of the 2-1 conductive semiconductor layer 127a to increase contact area with the second electrode 246.

The second electrode 246 may be deposited on the conductive first semiconductor layer 127a. When the second electrode is made of a metal oxide such as ITO, the conductive first semiconductor layer 127a may come in contact with oxygen. Accordingly, an aluminum oxide may be formed by aluminum that is provided on the surface of the conductive first semiconductor layer 127a to react with oxygen. In addition, a nitride such as NO and an oxide such as $Ga_2O_3$ may be additionally formed.

Referring to FIG. 22, an aluminum oxide C2 may be observed at an interface between the second electrode 246 and the conductive first semiconductor layer 127a. The interface may be observed using a transmission electron microscope (TEM).

Figure 23:
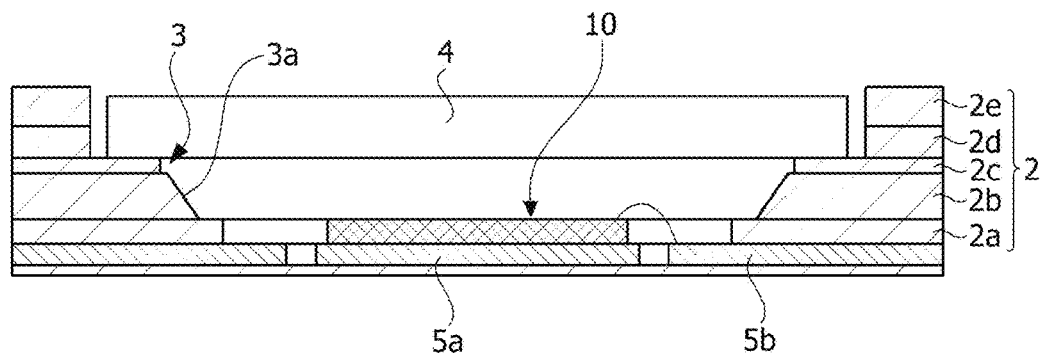
FIG. 23 is a diagram of a semiconductor device package according to an embodiment of the present disclosure.
Figure 24:
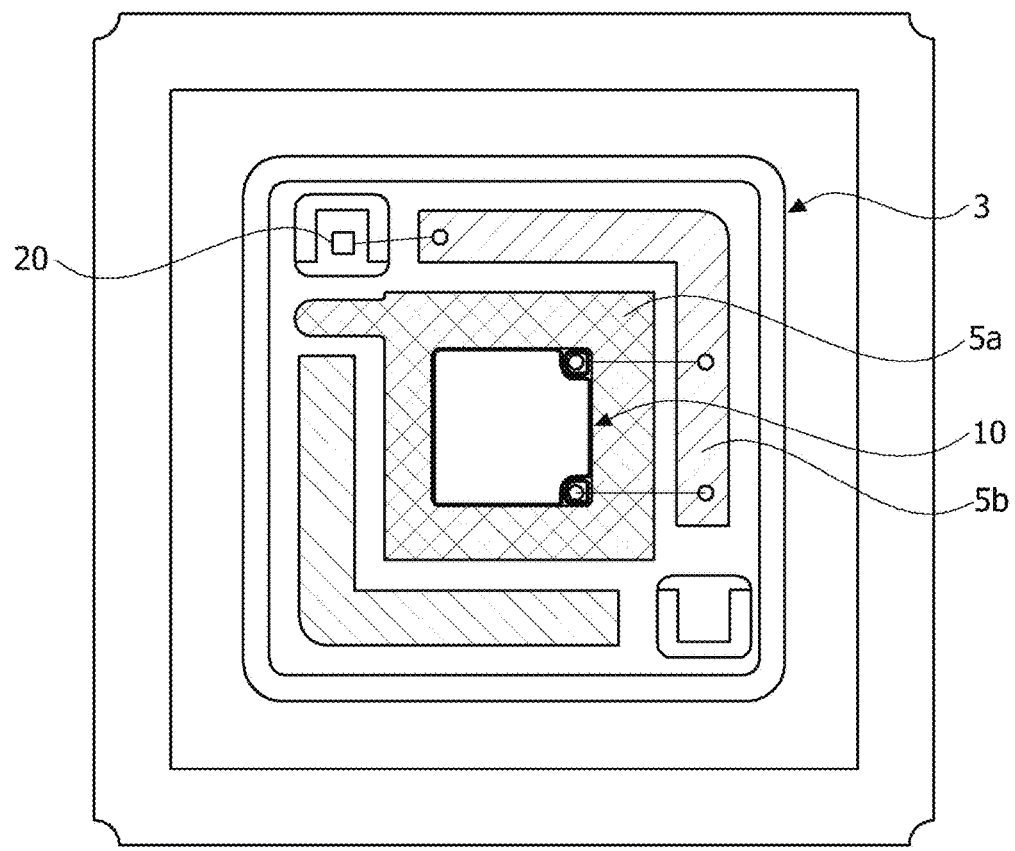
FIG. 24 is a plan view of the semiconductor device package according to an embodiment of the present disclosure.
Figure 25:
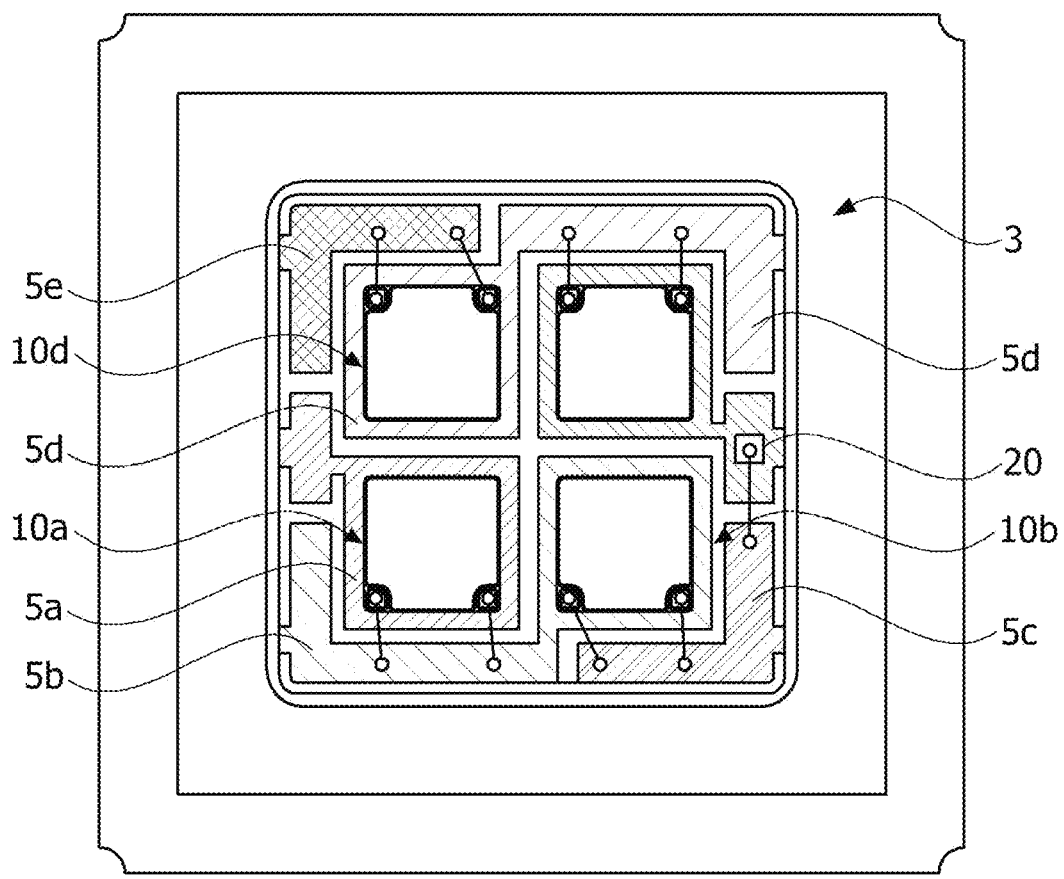
FIG. 25 is a modification of FIG. 24.

FIG. 23 is a diagram of a semiconductor device package according to an embodiment of the present disclosure, FIG. 24 is a plan view of the semiconductor device package according to an embodiment of the present disclosure, and FIG. 25 is a modification of FIG. 24.

Referring to FIG. 23, the semiconductor device package may include a body 2 with a groove (an opening) 3, a semiconductor device 1 provided in the body 2, and a pair of lead frames 5a and 5b provided in the body 2 and electrically connected to the semiconductor device 1. The semiconductor device 1 may include all of the above-described elements.

The body 2 may include a material or a coating layer that reflects ultraviolet light. The body 2 may be formed by stacking a plurality of layers 2a, 2b, 2c, 2d, and 2e. The plurality of layers 2a, 2b, 2c, 2d, and 2e may be made of the same material or include different materials. For example, the plurality of layers 2a, 2b, 2c, 2d, and 2e may include an aluminum material.

The groove 3 may have a width that increases away from the semiconductor device and may have an inclined surface having a stepped portion formed therein.

A light transmitting layer 4 may cover the groove 3. The light transmitting layer 4 may be made of glass, but is not limited thereto. There is no limitation in material of the light transmitting layer 4 as long as the material can effectively transmit ultraviolet light. The groove 3 may have an empty space formed therein.

Referring to FIG. 24, a semiconductor device 10 may be provided on a first lead frame 5a and connected with a second lead frame 5b by using a wire. In this case, the second lead frame 5b may be provided to surround the first lead frame 5a.

Referring to FIG. 25, the semiconductor device package may have a plurality of semiconductor devices 10a, 10b, 10c, and 10d provided therein. In this case, the lead frame may include a first lead frame 5a, a second lead frame 5b, a third lead frame 5c, a fourth lead frame 5d, and a fifth lead frame 5e.

The first semiconductor device 10a may be provided on the first lead frame 5a and connected with the second lead frame 5b using a wire. The second semiconductor device 10b may be provided on the second lead frame 5b and connected with the third lead frame 5c by using a wire. The third semiconductor device 10c may be provided on the third lead frame 5c and connected with the fourth lead frame 5d using a wire. The fourth semiconductor device 10d may be provided on the fourth lead frame 5d and connected with the fifth lead frame 5e using a wire.

The semiconductor device may be applied to various kinds of light source devices. For example, the light source devices may include a sterilizing device, a curing device, a lighting device, a display device, and a vehicle lamp. That is, the semiconductor device may be applied in various electronic devices provided in a housing and configured to provide light.

The sterilizing device may have a semiconductor device to sterilize a desired region according to an embodiment of the present disclosure. The sterilizing device may be applied to home appliances such as a water purifiers, air conditioners, and refrigerators, but is not limited thereto. That is, the sterilizing device may be applied in various products needing to be sterilized (e.g., medical apparatuses).

For example, a water purifier may have the sterilizing device to sterilize circulating water according to an embodiment of the present disclosure. The sterilizing device may be placed at a nozzle or a discharging port through which water circulates and configured to emit ultraviolet light. In this case, the sterilizing device may include a waterproof structure.

The curing device may have a semiconductor device to cure various kinds of liquids according to an embodiment of the present disclosure. The liquids may include various materials that are cured when ultraviolet light is emitted. For example, the curing device may cure various types of resins. Alternatively, the curing device may also be applied to cure beauty products such as manicure products.

The lighting device may, according to an embodiment of the present disclosure, include a light source module including a substrate and a semiconductor device, a heat dissipation unit configured to dissipate heat of the light source module, and a power supply unit configured to process or convert an electric signal from the outside and provide the electric signal to the light source module. Also, the lighting device may include a lamp, a headlamp, or a streetlight.

The display device may include a bottom cover, a reflective plate, a light emitting module, a light guide plate, an optical sheet, a display panel, an image signal output circuit, and a color filter. The bottom cover, the reflective plate, the light emitting module, the light guide plate, and the optical sheet may constitute a backlight unit.

The reflective plate may be placed on the bottom cover, and the light emitting module may emit light. The light guide plate may be placed in front of the reflective plate to guide light emitted by the light emitting module forward. The optical sheet may include a prism sheet or the like and may be placed in front of the light guide plate. The display panel may be placed in front of the optical sheet. The image signal output circuit may supply an image signal to the display panel. The color filter may be placed in front of the display panel.

When the semiconductor device is used as a backlight unit of a display device, the semiconductor device may be used as an edge-type backlight unit or a direct-type backlight unit.

The semiconductor device may be a laser diode rather than the above-described light emitting diode.

Like the light emitting device, the laser diode may include a first conductive semiconductor layer, an active layer, and a second conductive semiconductor layer that have the above-described structures. The laser diode may also utilize an electroluminescence phenomenon in which light is emitted when electric current flows after a p-type first conductive semiconductor and an n-type second conductive semiconductor are brought in contact with each other, but has a difference in the directionality and phase of the emitted light. That is, the laser diode uses stimulated emission and constructive interference so that light having a specific single wavelength may be emitted at the same phase and in the same direction. Due to these characteristics, the laser diode may be used for an optical communication device, a medical device, a semiconductor processing device, or the like.

A light receiving device may include, for example, a photodetector, which is a kind of transducer configured to detect light and convert intensity of the light into an electric signal. The photodetector may include a photocell (silicon and selenium), an optical output element (cadmium sulfide and cadmium selenide), a photodiode (e.g., a PD with a peak wavelength in a visible blind spectral region or a true blind spectral region), a photo transistor, a photomultiplier, a photoelectric tube (vacuum and gas filling), an infra-red (IR) detector, or the like, but is not limited thereto.

Generally, a semiconductor device such as the photodetector may be produced using a direct bandgap semiconductor having good photoelectric transformation efficiency. Alternatively, the photodetector may have various structures. As the most common structure, the photodetector may include a pin-type photodetector using a p-n junction, a Schottky photodetector using a Schottky junction, a metal-semiconductor-metal (MSM) photodetector, or the like.

Like the light emitting device, the photodiode may include a first conductive semiconductor layer and a second conductive semiconductor layer that have the above-described structures and may be formed as a p-n junction or a pin structure. The photodiode operates when a reverse bias or a zero bias is applied. When light is incident on the photodiode, electrons and holes are generated such that electric current flows. In this case, the magnitude of electric current may be approximately proportional to intensity of light incident on the photodiode.

A photocell or a solar cell, which is a kind of photodiode, may convert light into electric current. Like the light emitting device, the solar cell may include a first conductive semiconductor layer, an active layer, and a second conductive semiconductor layer that have the above-described structures.

Also, the solar cell may be used as a rectifier of an electronic circuit through the rectification characteristics of a general diode using a p-n junction and may be applied to an oscillation circuit or the like of a microwave circuit.

Also, the above-described semiconductor device is not necessarily implemented only with semiconductors. Depending on the case, the semiconductor device may additionally include a metal material. For example, a semiconductor device such as the light receiving device may be implemented using at least one of Ag, Al, Au, In, Ga, N, Zn, Se, P, and As and may be implemented using an intrinsic semiconductor material or a semiconductor material doped with a p-type dopant or an n-type dopant.

Depending on the embodiments of the present disclosure, it is possible to produce a vertical ultraviolet light emitting device.

Also, it is possible to enhance optical output power by suppressing absorption of light in the semiconductor device.

Also, it is possible to reduce contact resistance between the second conductive semiconductor layer and the second electrode without a GaN thin film.

Various advantages and effects of the present disclosure are not limited to the above description and may be more easily understood while the embodiments of the present disclosure are described in detail.

While the present disclosure has been described with reference to exemplary embodiments, these are just examples and do not limit the present disclosure. It will be understood by those skilled in the art that various modifications and applications may be made therein without departing from the essential characteristics of the embodiments. For example, elements described in the embodiments above in detail may be modified and implemented. Furthermore, differences associated with such modifications and applications should be construed as being included in the scope of the present disclosure defined by the appended claims.

An embodiment provides a vertical ultraviolet light emitting device.

An embodiment also provides a light emitting device having enhanced optical output power.

Problems to be solved in the embodiments are not limited thereto, and include the following technical solutions and objectives or effects understandable from the embodiments.

According to an aspect of the present disclosure, there is provided a semiconductor device including a semiconductor structure including a first conductive semiconductor layer, a second conductive semiconductor layer, and an active layer provided between the first conductive semiconductor layer and the second conductive semiconductor layer. The active layer may include a plurality of barrier layers and a plurality of well layers. The second conductive semiconductor layer may include a 2-2 conductive semiconductor layer and a 2-1 conductive semiconductor layer provided on the 2-2 conductive semiconductor layer. The barrier layers, the well layers, the 2-2 conductive semiconductor layer, and the 2-1 conductive semiconductor layer may include AlGaN. The 2-2 conductive semiconductor layer may have a higher aluminum composition than the well layers, and the 2-1 conductive semiconductor layer may have a lower aluminum composition than the well layers.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor device comprising:
   a light emitting structure that comprises:
      a first conductivity type semiconductor layer having aluminum;
      a second conductivity type semiconductor layer having aluminum; and
      an active layer having aluminum and provided between the first conductivity type semiconductor layer and the second conductivity type semiconductor layer,
   wherein:
      when primary ions are bombarded on the light emitting structure to sputter away secondary ions of aluminum from the first conductivity type semiconductor layer, the active layer and the second conductivity type semiconductor layer, secondary ions of aluminum are produced in respective intensities for the first conductivity type semiconductor layer, the active layer, and the second conductivity type semiconductor layer,
      an intensity of the secondary ions of aluminum comprises a maximum intensity in the light emitting structure, a minimum intensity in the light emitting structure, a second intensity which is the smallest intensity in a region spaced away from the maximum intensity in a first direction, and a first peak intensity spaced away from the maximum intensity which is the greatest peak intensity in a region disposed between the maximum intensity and the second intensity,
      wherein the maximum intensity is spaced away from the minimum intensity in the first direction, and the first peak intensity is spaced away from the maximum intensity in the first direction,
      wherein the first conductivity type semiconductor layer includes a first region having the intensity of the secondary ions be between the first peak intensity and the second intensity, the second conductivity type semiconductor layer includes a second region having the intensity of the secondary ions be between the maximum intensity and the minimum intensity, and the active layer includes a third region having the intensity of the secondary ions be between the maximum intensity and the first peak intensity,
   wherein the first direction is a thickness direction of the light emitting structure from the second conductivity type semiconductor layer towards the first conductivity type semiconductor layer,
   wherein a first intensity difference (D1) between the maximum intensity and the second intensity is greater than a second intensity difference (D2) between the minimum intensity and the second intensity.

2. The semiconductor device of claim 1, wherein the intensity of the secondary ions comprises a plurality of increasing regions, a plurality of decreasing regions, and a plurality of peak intensities formed based on a transition between the increasing regions and the decreasing regions,
   wherein the plurality of peak intensities comprises the first peak intensity, a plurality of sub peaks and a plurality of sub valleys,
   wherein the plurality of sub peaks and the plurality of sub valleys are disposed between the maximum intensity and the first peak intensity, and
   wherein the second intensity is spaced away from the first peak intensity in the first direction.

3. The semiconductor device of claim 2, wherein the active layer comprises a plurality of barrier layers and a plurality of well layers,
   wherein an intensity of the secondary ions in the plurality of barrier layers comprises the plurality of sub peaks, and
   wherein an intensity of the secondary ions in the plurality of well layers comprises the plurality of sub valleys.

4. The semiconductor device of claim 1, wherein the intensity of the secondary ions is a data measured by Time-of-Flight secondary ion mass spectrometry (TOF-SIMS),
   wherein TOF-SIMS data is analyzed by emitting primary ions including $O_2^+$, $Cs^+$, $Bi^+$ to a target surface and counting a number of secondary ions discharged,
   wherein measurement condition of the TOF-SIMS comprises an acceleration voltage adjusted within a range of about 20 keV to about 30 KeV and an emitted current adjusted within a range of about 0.1 pA to about 5.0 pA.

5. The semiconductor device of claim 1, wherein the minimum intensity is exhibited at a surface of the second conductivity type semiconductor layer.

6. The semiconductor device of claim 1, wherein a ratio (D1:D2) of the first intensity difference to the second intensity difference ranges from 1:0.2 to 1:2.

7. The semiconductor device of claim 1, wherein at a first prescribed distance from a surface of the second conductivity type semiconductor layer, the second conductivity type semiconductor layer exhibits a first intermediate intensity of the secondary ions corresponding to the second intensity, which is between the minimum intensity and the maximum intensity, wherein the maximum intensity occurs at a second prescribed distance from the first prescribed distance,
   wherein a ratio of the second prescribed distance to the first prescribed distance is within a range of 1:0.2 to 1:1.

8. The semiconductor device of claim 7, wherein the intensity exhibited in the second conductivity type semiconductor layer between the minimum intensity and the first intermediate intensity comprises two intensity peaks and an intensity valley between the two intensity peaks.

9. The semiconductor device of claim 8, wherein the intensity at the two intensity peaks is greater than the intensity at the intensity valley.

10. The semiconductor device of claim 1, wherein the second conductivity type semiconductor layer is a P-type semiconductor layer and a blocking layer, and the first conductivity type semiconductor layer is an N-type semiconductor layer.

11. The semiconductor device of claim 10, wherein the second conductivity type semiconductor layer comprises a P-type dopant including Mg and the first conductivity type semiconductor layer comprises an N-type dopant including Si.

12. The semiconductor device of claim 1, wherein the first conductivity type semiconductor layer exhibits the first peak intensity at a portion of the first conductivity type semiconductor layer closest to the active layer.

13. The semiconductor device of claim 12, wherein the intensity exhibited in the active layer is smaller than the maximum intensity and the first peak intensity and is greater than the minimum intensity and the second intensity.

14. The semiconductor device of claim 1, further comprising:
   a first electrode electrically connected with the first conductivity type semiconductor layer; and
   a second electrode electrically connected with the second conductivity type semiconductor layer,
   wherein:
      the second conductivity type semiconductor layer comprises a first surface on which the second electrode is positioned, the first surface being positioned opposite to the active layer; and
      the second conductivity type semiconductor layer exhibits the minimum intensity at the first surface.

15. The semiconductor device of claim 1, wherein the second conductivity type semiconductor layer comprises a blocking layer provided as a portion of the second conductivity type semiconductor layer closest to the active layer.

16. The semiconductor device of claim 15, wherein the maximum intensity is exhibited in the blocking layer.

17. The semiconductor device of claim 1, wherein:
   the second conductivity type semiconductor layer comprises a first sublayer and a second sublayer, wherein the first sublayer comprises a first surface to receive the primary ions prior to a second surface of the first sublayer and prior to the second sublayer, wherein the first sublayer has a lower composition of aluminum than the second sublayer,
   wherein each of the first sublayer and the second sublayer comprises aluminum-gallium-nitride (AlGaN).

18. The semiconductor device of claim 1, wherein the first intensity difference is greater than 0, and the second intensity difference is greater than 0.

19. The semiconductor device of claim 1, wherein the first conductivity type semiconductor layer comprises a first conductivity type semiconductor material having an empirical formula $In_{x1}Al_{y1}Ga_{1-x1-y1}N$ ($0 \le x1 \le 1$, $0 \le y1 \le 1$, and $0 \le x1+y1 \le 1$), and the second conductivity type semiconductor layer comprises a second conductivity type semiconductor material having an empirical formula $In_{x5}Al_{y2}Ga_{1-x5-y2}N$ ($0 \le x5 \le 1$, $0 \le y2 \le 1$, and $0 \le x5+y2 \le 1$).

20. A semiconductor device package comprising:
   a body; and a semiconductor device disposed on the body, wherein the semiconductor device has a light emitting structure including:
- a first conductivity type semiconductor layer having aluminum;
- a second conductivity type semiconductor layer having aluminum; and
- an active layer having aluminum and provided between the first conductivity type semiconductor layer and the second conductivity type semiconductor layer, wherein:
- when primary ions are bombarded on the light emitting structure to sputter away secondary ions of aluminum from the first conductivity type semiconductor layer, the active layer and the second conductivity type semiconductor layer, secondary ions of aluminum are produced in respective intensities for the first conductivity type semiconductor layer, the active layer, and the second conductivity type semiconductor layer,
- an intensity of the secondary ions of aluminum comprises a maximum intensity in the light emitting structure, a minimum intensity in the light emitting structure, a second intensity which is the smallest intensity in a region spaced away from the maximum intensity in a first direction, and a first peak intensity spaced away from the maximum intensity which is the greatest peak intensity in a region disposed between the maximum intensity and the second intensity,
- wherein the maximum intensity is spaced away from the minimum intensity in the first direction and the first peak intensity is spaced away from the maximum intensity in the first direction,
  - wherein the first conductivity type semiconductor layer includes a first region having the intensity of the secondary ions be between the first peak intensity and the second intensity, the second conductivity type semiconductor layer includes a second region having the intensity of the secondary ions be between the maximum intensity and the minimum intensity, and the active layer includes a third region having the intensity of the secondary ions be between the maximum intensity and the first peak intensity, wherein the first direction is a thickness direction of the light emitting structure from the second conductivity type semiconductor layer towards the first conductivity type semiconductor layer,
- wherein a first intensity difference (D1) between the maximum intensity and the second intensity is greater than a second intensity difference (D2) between the minimum intensity and the second intensity.

* * * * *